(12) United States Patent
Hur et al.

(10) Patent No.: US 12,510,805 B2
(45) Date of Patent: Dec. 30, 2025

(54) CAMERA MODULE AND ELECTRONIC DEVICE INCLUDING THE SAME

(71) Applicant: Samsung Electronics Co., Ltd., Suwon-si (KR)

(72) Inventors: Dongsung Hur, Suwon-si (KR); Hyunho Yu, Suwon-si (KR); Donghun Yu, Suwon-si (KR); Youngbok Yu, Suwon-si (KR); Youngjae Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 910 days.

(21) Appl. No.: 17/571,350

(22) Filed: Jan. 7, 2022

(65) Prior Publication Data

US 2022/0221771 A1    Jul. 14, 2022

Related U.S. Application Data

(63) Continuation of application No. PCT/KR2021/018358, filed on Dec. 6, 2021.

(30) Foreign Application Priority Data

Jan. 8, 2021   (KR) .................. 10-2021-0002834

(51) Int. Cl.
   *G03B 13/36*   (2021.01)
   *H01F 7/08*   (2006.01)
   *G02B 7/18*   (2021.01)

(52) U.S. Cl.
   CPC ............ *G03B 13/36* (2013.01); *H01F 7/081* (2013.01); *G02B 7/18* (2013.01)

(58) Field of Classification Search
   None
   See application file for complete search history.

(56) References Cited

U.S. PATENT DOCUMENTS 8,442,393 B2   5/2013 Bang et al.
8,965,189 B2   2/2015 Kang et al.
(Continued)

FOREIGN PATENT DOCUMENTS

KR   10-2013-0062635 A   6/2013
KR   10-2016-0084660 A   7/2016
(Continued)

OTHER PUBLICATIONS

International Search Report and Written Opinion of the International Searching Authority in connection with International Patent Application No. PCT/KR2021/018358 issued Mar. 21, 2022, 18 pages.

(Continued)

*Primary Examiner* — Bumsuk Won
*Assistant Examiner* — Tamara Y. Washington

(57) ABSTRACT

A camera module includes a camera housing; a lens assembly, part of which is accommodated in the camera housing; and a stopper member coupled to the inside of the camera housing. The lens assembly includes a lens and moves in a direction of an optical axis of the lens inside the camera housing. At least part of the stopper member limits a movement range of the lens assembly in the direction of the optical axis. The stopper member includes a first stopper member to limit the movement range of the lens assembly in a first optical axis direction, and a second stopper member to limit the movement range of the lens assembly in a second optical axis direction opposite to the first optical axis direction. The first and second stopper members are configured to provide damping when the lens assembly makes contact with the first and second stopper members.

13 Claims, 21 Drawing Sheets

(56) References Cited

U.S. PATENT DOCUMENTS

| | | |
|---|---|---|
| 9,829,673 B2 | 11/2017 | Shin et al. |
| 10,054,758 B2 | 8/2018 | Kim |
| 10,126,633 B2 | 11/2018 | Avivi et al. |
| 10,203,469 B2 | 2/2019 | Byon et al. |
| 10,372,022 B2 | 8/2019 | Avivi et al. |
| 10,386,596 B2 | 8/2019 | Shin et al. |
| 10,534,194 B2 | 1/2020 | Lee et al. |
| 10,715,730 B1 | 7/2020 | Xu et al. |
| 10,845,567 B2 | 11/2020 | Shin et al. |
| 10,969,652 B2 | 4/2021 | Miller et al. |
| 11,159,727 B2 | 10/2021 | Lee et al. |
| 11,277,548 B2 | 3/2022 | Park et al. |
| 11,567,338 B2 | 1/2023 | Enta et al. |
| 11,570,337 B2 | 1/2023 | Park et al. |
| 11,575,812 B2 | 2/2023 | Park et al. |
| 11,736,788 B2 | 8/2023 | Park et al. |
| 2011/0103781 A1 | 5/2011 | Bang et al. |
| 2013/0142502 A1 | 6/2013 | Kang et al. |
| 2015/0116515 A1 | 4/2015 | Kang et al. |
| 2015/0212291 A1* | 7/2015 | Lee ............... H04N 23/687 348/360 |
| 2016/0341926 A1 | 11/2016 | Byon et al. |
| 2017/0205600 A1 | 7/2017 | Kim |
| 2018/0120674 A1 | 5/2018 | Avivi et al. |
| 2018/0239162 A1 | 8/2018 | Lee et al. |
| 2019/0212632 A1 | 7/2019 | Miller et al. |
| 2020/0103673 A1 | 4/2020 | Lee et al. |
| 2020/0174270 A1 | 6/2020 | Enta et al. |
| 2020/0344417 A1 | 10/2020 | Xu et al. |
| 2020/0348479 A1 | 11/2020 | Kwon et al. |
| 2020/0351421 A1 | 11/2020 | Park et al. |
| 2020/0404181 A1 | 12/2020 | Lee et al. |
| 2021/0223662 A1 | 7/2021 | Miller et al. |
| 2021/0302687 A1 | 9/2021 | Jang |
| 2022/0124228 A1 | 4/2022 | Park et al. |
| 2022/0159151 A1 | 5/2022 | Park et al. |

FOREIGN PATENT DOCUMENTS

| | | |
|---|---|---|
| KR | 10-1653762 B1 | 9/2016 |
| KR | 10-2017-0021610 A | 2/2017 |
| KR | 10-2017-0059957 A | 5/2017 |
| KR | 10-2017-0131320 A | 11/2017 |
| KR | 10-2018-0095420 A | 8/2018 |
| KR | 10-2020-0015051 A | 2/2020 |
| KR | 10-2020-0097766 A | 8/2020 |
| KR | 10-2020-0126873 A | 11/2020 |

OTHER PUBLICATIONS

Supplementary European Search Report dated Apr. 17, 2024, in connection with European Patent Application No. 21917899.3, 11 pages.

Supplementary European Search Report dated Jul. 9, 2024, in connection with European Patent Application No. 21917899.3, 10 pages.

Office Action dated Feb. 27, 2025 issued for the corresponding Russian Patent Application No. 2023114194, 13 pages.

\* cited by examiner

CAMERA MODULE AND ELECTRONIC DEVICE INCLUDING THE SAME

CROSS-REFERENCE TO RELATED APPLICATIONS

This application is a continuation of International Application No. PCT/KR2021/018358 filed on Dec. 6, 2021, which claims priority to Korean Patent Application No. 10-2021-0002834 filed on Jan. 8, 2021, the disclosures of which are herein incorporated by reference in their entirety.

BACKGROUND

1. Field

Various embodiments of the disclosure described herein relate to a camera module and an electronic device including the same.

2. Description of Related Art

A mobile electronic device, such as a smartphone, may include a camera module. The camera module may include lenses, a lens barrel surrounding the lenses, and an image sensor. The camera module may receive light reflected from an external subject. The light reflected from the subject may travel into the lens barrel, may pass through the lenses, and may travel to the image sensor. The image sensor may convert the received light signal into a related electrical signal.

The camera module may provide an auto focus (AF) function of adjusting a focus by moving the lenses in the direction of the optical axis. The auto focus function may be automatically performed by using a sensor, or may be performed by selection of a user.

When the electronic device and/or the camera module is in an unpowered state, the lens assembly including the lenses may fail to remain at a fixed position and may move in the camera housing. The movement of the lens assembly may increase a risk of damage to the lenses and may cause deterioration in image quality.

Embodiments of the disclosure provide a camera module for limiting a movement range of a lens assembly and reducing noise caused by collision of components of the camera module when the camera module and/or an electronic device is in an unpowered state, and an electronic device including the camera module.

The technical problems to be solved by the disclosure are not limited to the aforementioned problems, and any other technical problems not mentioned herein will be clearly understood from the following description by those skilled in the art to which the disclosure pertains.

SUMMARY

A camera module according to an embodiment of the disclosure includes a camera housing, a lens assembly, at least part of which is accommodated in the camera housing, the lens assembly including a lens, in which the lens assembly moves along a direction of an optical axis of the lens inside the camera housing, and a stopper member coupled to the inside of the camera housing and at least part of the stopper member limits a movement range of the lens assembly in the direction of the optical axis. The stopper member includes a first stopper member to limit the movement range of the lens assembly in a first optical axis direction and a second stopper member to limit the movement range of the lens assembly in a second optical axis direction opposite to the first optical axis direction, and the first stopper member and the second stopper member are configured to provide damping when the lens assembly makes contact with the first stopper member and the second stopper member.

A camera module according to an embodiment of the disclosure includes a camera housing including a light receiving area on which external light is incident, in which an image sensor is disposed on a side of the camera housing, a lens assembly that is accommodated in the camera housing and that includes a lens and moves in a direction of an optical axis of the lens inside the camera housing, a first reflective member that is accommodated in the camera housing and that directs the external light incident through the light receiving area toward the lens, a second reflective member that is disposed in the camera housing to face the first reflective member with the lens assembly therebetween and that directs the external light passing through the lens toward the image sensor, a support member that is coupled to the lens assembly to move together with the lens assembly and that extends toward the second reflective member, and a damping member that is disposed on a sidewall of the camera housing and that makes contact with a portion of the support member as the lens assembly moves in the direction of the optical axis.

The electronic device according to the various embodiments of the disclosure may limit a movement range of the lens assembly when power is not applied to the electronic device or the camera module, thereby preventing damage to the camera module.

Furthermore, the electronic device according to the various embodiments of the disclosure may be configured such that the structure limiting a movement range of the lens assembly includes the stopper and/or the damper. Accordingly, the electronic device may absorb or dissipate an impact caused by collision of components of the camera module and may reduce noise.

In addition, the disclosure may provide various effects that are directly or indirectly recognized.

BRIEF DESCRIPTION OF THE DRAWINGS

For a more complete understanding of the present disclosure and its advantages, reference is now made to the following description taken in conjunction with the accompanying drawings.

With regard to description of the drawings, identical or similar reference numerals may be used to refer to identical or similar components.

DETAILED DESCRIPTION

FIGS. 1 through 20, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
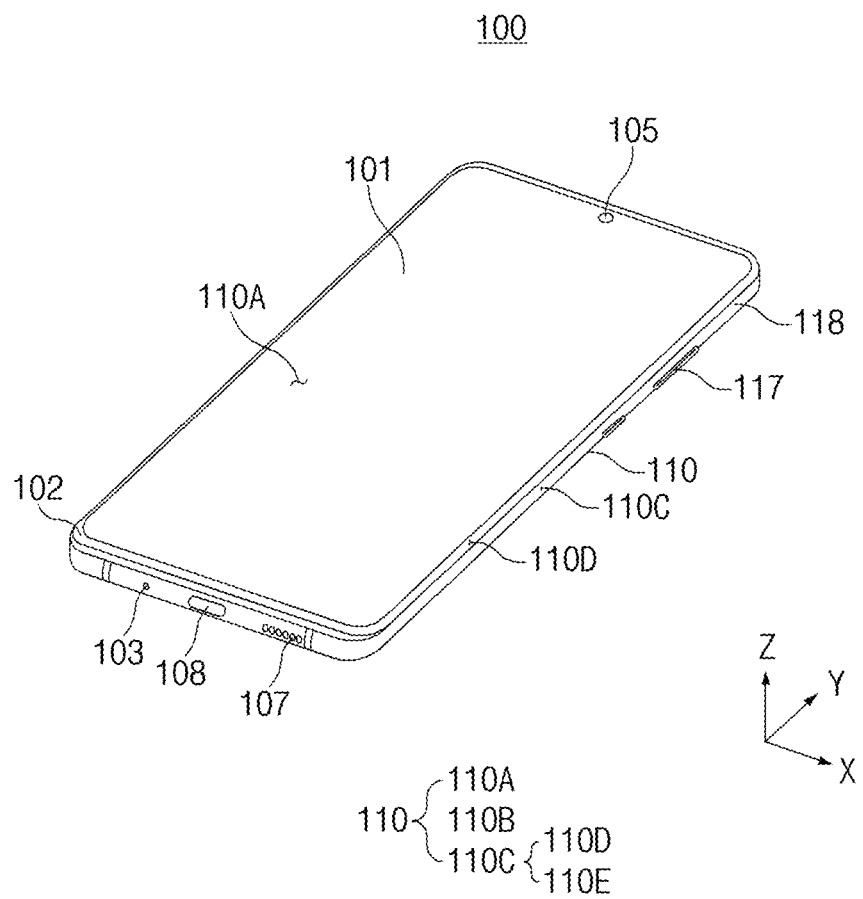
FIG. 1 is a front perspective view of an electronic device according to an embodiment.
Figure 2:
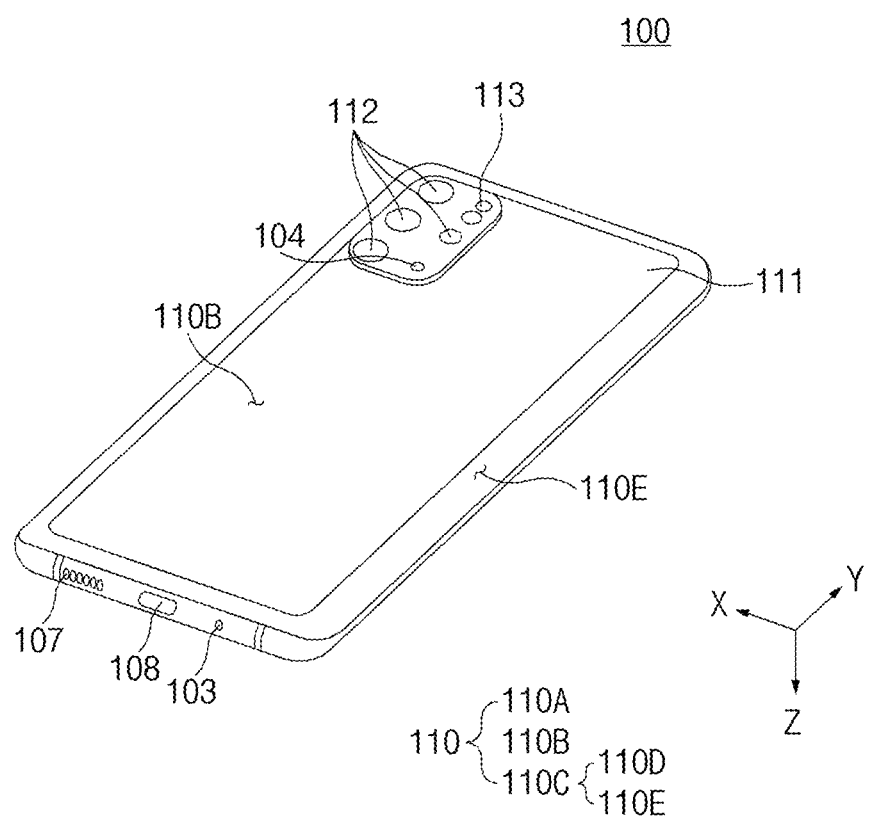
FIG. 2 is a rear perspective view of the electronic device according to an embodiment.

FIG. 1 is a front perspective view of an electronic device 100 according to an embodiment. FIG. 2 is a rear perspective view of the electronic device 100 according to an embodiment.

Referring to FIGS. 1 and 2, the electronic device 100 according to an embodiment may include a housing 110 that includes a first surface (or a front surface) 110A, a second surface (or a rear surface) 110B, and a third surface (or a side surface) 110C surrounding a space between the first surface 110A and the second surface 110B.

In another embodiment, the housing 110 may refer to a structure that forms some of the first surface 110A, the second surface 110B, and the third surface 110C.

In an embodiment, the first surface 110A may be formed by a front plate 102, at least a portion of which is substantially transparent (e.g., a glass plate including various coating layers, or a polymer plate). The second surface 110B may be formed by a back plate 111 that is substantially opaque. The back plate 111 may be formed of, for example, coated or colored glass, ceramic, polymer, metal (e.g., aluminum, stainless steel (STS), or magnesium), or a combination of at least two of the aforementioned materials. The third surface 110C may be formed by a side bezel structure (or a side member) 118 that is coupled with the front plate 102 and the back plate 111 and that contains metal and/or polymer.

In another embodiment, the back plate 111 and the side bezel structure 118 may be integrally formed with each other and may contain the same material (e.g., a metallic material such as aluminum).

In the illustrated embodiment, the front plate 102 may include two first areas 110D that curvedly and seamlessly extend from partial areas of the first surface 110A toward the back plate 111. The first areas 110D may be located at opposite long edges of the front plate 102.

In the illustrated embodiment, the back plate 111 may include two second areas 110E that curvedly and seamlessly extend from partial areas of the second surface 110B toward the front plate 102. The second areas 110E may be located at opposite long edges of the back plate 111.

In another embodiment, the front plate 102 (or the back plate 111) may include only one of the first areas 110D (or the second areas 110E). Furthermore, in another embodiment, the front plate 102 (or the back plate 111) may not include a part of the first areas 110D (or the second areas 110E).

In an embodiment, when viewed from a side of the electronic device 100, the side bezel structure 118 may have a first thickness (or width) at sides (e.g., short sides) not including the first areas 110D or the second areas 110E and may have a second thickness at sides (e.g., long sides) including the first areas 110D or the second areas 110E, the second thickness being smaller than the first thickness.

Figure 19:
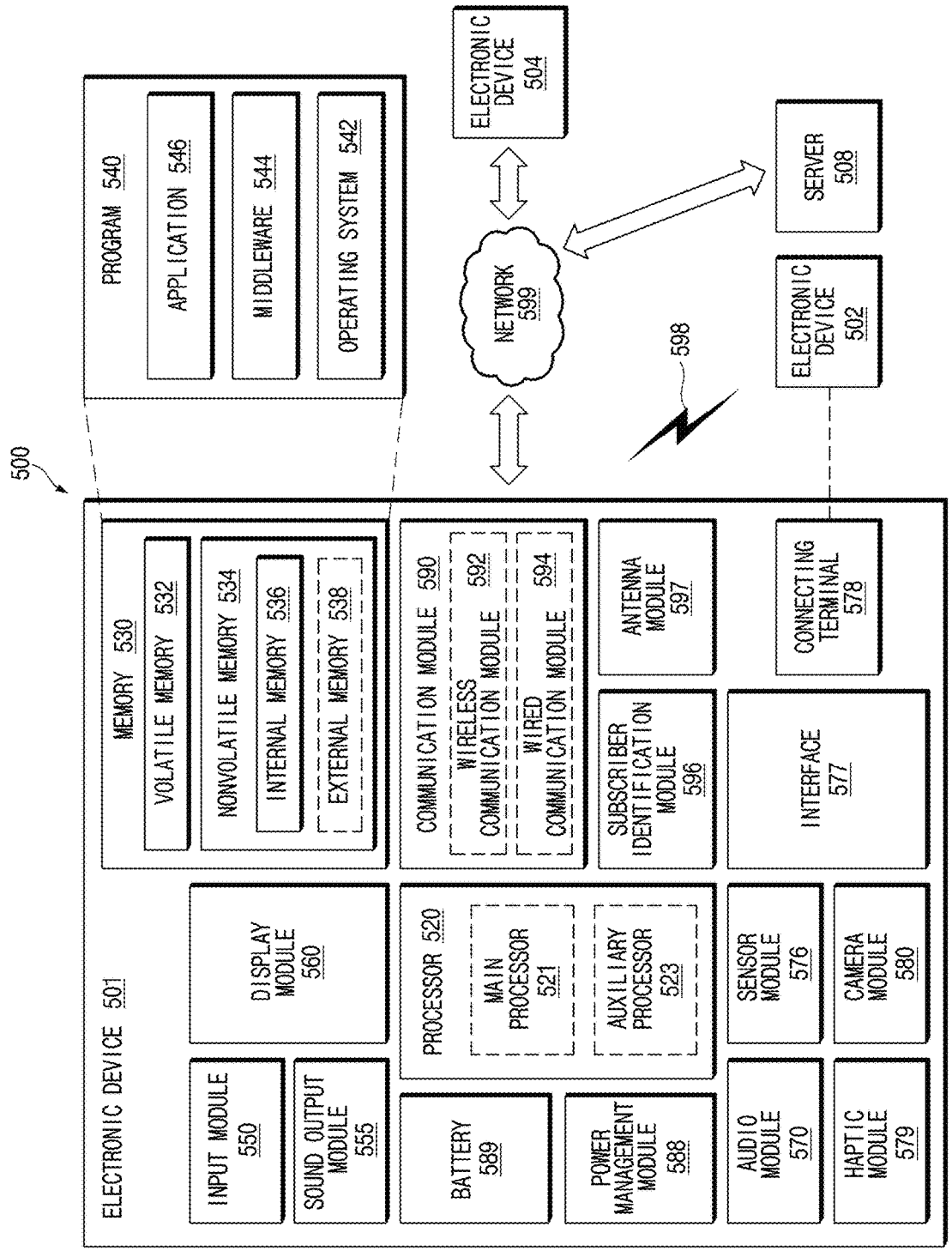
FIG. 19 is a block diagram of an electronic device in a network environment according to various embodiments.

In an embodiment, the electronic device 100 may include at least one of a display 101, an audio module 103, 104, and 107 (e.g., an audio module 570 of FIG. 19), a sensor module (not illustrated) (e.g., a sensor module 576 of FIG. 19), camera modules 105 112, and 113 (e.g., a camera module 580 of FIG. 19), key input devices 117 (e.g., an input module 550 of FIG. 19), a light emitting element (not illustrated), or a connector hole 108 (e.g., a connecting terminal 578 of FIG. 19). In another embodiment, the electronic device 100 may not include at least one component (e.g., the key input devices 117 or the light emitting element (not illustrated)) among the aforementioned components, or may additionally include other component(s).

In an embodiment, the display 101 may be visually exposed through most of the front plate 102. For example, at least part of the display 101 may be visually exposed through the front plate 102 that includes the first surface 110A and the first areas 110D of the third surface 110C. The display 101 may be disposed on the rear surface of the front plate 102.

In an embodiment, the periphery of the display 101 may be formed to be substantially the same as the shape of the adjacent outside edge of the front plate 102. In another embodiment, the gap between the outside edge of the display 101 and the outside edge of the front plate 102 may be substantially constant to expand the area by which the display 101 is visually exposed.

In an embodiment, a surface of the housing 110 (or the front plate 102) may include a screen display area that is formed as the display 101 is visually exposed. For example, the screen display area may include the first surface 110A and the first areas 110D of the side surface.

In another embodiment, the screen display area 110A and 110D may include a sensing area (not illustrated) that is configured to obtain biometric information of a user. Here, when the screen display area 110A and 110D includes the sensing area, this may mean that at least part of the sensing area overlaps the screen display area 110A and 110D. For example, the sensing area (not illustrated) may refer to an area capable of displaying visual information by the display 101 like other areas of the screen display area 110A and 110D and additionally obtaining biometric information (e.g., a fingerprint) of the user.

In an embodiment, the screen display area 110A and 110D of the display 101 may include an area through which the first camera module 105 (e.g., a punch hole camera) is visually exposed. For example, at least part of the periphery of the area through which the first camera module 105 is visually exposed may be surrounded by the screen display area 110A and 110D. In various embodiments, the first camera module 105 may include a plurality of camera modules (e.g., the camera module 580 of FIG. 19).

In various embodiments, the display 101 may be configured such that at least one of an audio module (not illustrated), a sensor module (not illustrated), a camera module (e.g., the first camera module 105), or a light emitting element (not illustrated) is disposed on the rear surface of the screen display area 110A and 110D. For example, the electronic device 100 may be configured such that the first camera module 105 (e.g., an under display camera (UDC)) is disposed on the rear side (e.g., the side facing the −z-axis direction) of the first surface 110A (e.g., the front surface) and/or the side surface 110C (e.g., at least one surface of the first areas 110D) so as to face toward the first surface 110A and/or the side surface 110C. For example, the first camera module 105 may be disposed under the display 101 and may not be visually exposed through the screen display area 110A and 110D.

In another embodiment (not illustrated), the display 101 may be coupled with, or disposed adjacent to, touch detection circuitry, a pressure sensor capable of measuring the intensity (pressure) of a touch, and/or a digitizer for detecting a stylus pen of a magnetic field type.

In an embodiment, the audio module 103, 104, and 107 may include the microphone holes 103 and 104 and the speaker hole 107.

In an embodiment, the microphone holes 103 and 104 may include the first microphone hole 103 formed in a partial area of the third surface 110C and the second microphone hole 104 formed in a partial area of the second surface 110B. A microphone (not illustrated) for obtaining an external sound may be disposed in the microphone holes 103 and 104. The microphone may include a plurality of microphones to detect the direction of a sound.

In an embodiment, the second microphone hole 104 formed in the partial area of the second surface 110B may be disposed adjacent to the camera modules 105, 112, and 113. For example, the second microphone hole 104 may obtain sounds when the camera modules 105, 112, and 113 are executed, or may obtain sounds when other functions are executed.

In an embodiment, the speaker hole 107 may include an external speaker hole 107 and a receiver hole for telephone call (not illustrated). The external speaker hole 107 may be formed in a portion of the third surface 110C of the electronic device 100. In another embodiment, the external speaker hole 107 and the microphone hole 103 may be implemented as a single hole. Although not illustrated, the receiver hole for telephone call (not illustrated) may be formed in another portion of the third surface 110C. For example, the receiver hole for telephone call may be formed in another portion (e.g., a portion facing the +y-axis direction) of the third surface 110C that faces the portion (e.g., a portion facing the −y-axis direction) of the third surface 110C in which the external speaker hole 107 is formed. According to various embodiments, the receiver hole for telephone call may not be formed in a portion of the third surface 110C and may be formed by a separation space between the front plate 102 (or the display 101) and the side bezel structure 118.

In an embodiment, the electronic device 100 may include at least one speaker (not illustrated) that is configured to output a sound outside the housing 110 through the external speaker hole 107 or the receiver hole for telephone call (not illustrated). According to various embodiments, the speaker may include a piezoelectric speaker not including the speaker hole 107.

In an embodiment, the sensor module (not illustrated) may generate an electrical signal or a data value that corresponds to an operational state inside the electronic device 100 or an environmental state external to the electronic device 100. For example, the sensor module may include at least one of a proximity sensor, an HRM sensor, a fingerprint sensor, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor.

In an embodiment, the camera modules 105, 112, and 113 may include the first camera module 105 (e.g., a punch hole camera) exposed on the first surface 110A of the electronic device 100, the second camera module 112 exposed on the second surface 110B, and/or the flash 113.

In an embodiment, the first camera module 105 may be visually exposed through part of the screen display area 110A and 110D of the display 101. For example, the first camera module 105 may be visually exposed on a partial area of the screen display area 110A and 110D through an opening (not illustrated) that is formed in part of the display 101. In another example, the first camera module 105 (e.g., an under display camera) may be disposed on the rear surface of the display 101 and may not be visually exposed through the screen display area 110A and 110D.

In an embodiment, the second camera module 112 may include a plurality of cameras (e.g., a dual camera, a triple camera, or a quad camera). However, the second camera module 112 is not necessarily limited to including the plurality of cameras and may include one camera.

In an embodiment, the first camera module 105 and the second camera module 112 may include one or more lenses, an image sensor, and/or an image signal processor. The flash 113 may include, for example, a light emitting diode or a xenon lamp. In another embodiment, two or more lenses (an IR camera lens, a wide angle lens, and a telephoto lens) and image sensors may be disposed on one surface of the electronic device 100.

In an embodiment, the key input devices 117 may be disposed on the third surface 110C (e.g., the first areas 110D and/or the second areas 110E) of the housing 110. In another embodiment, the electronic device 100 may not include all or some of the key input devices 117, and the key input devices 117 not included may be implemented in a different form, such as a soft key, on the display 101. In another embodiment, the key input devices may include a sensor module (not illustrated) that forms the sensing area (not illustrated) that is included in the display area 110A and 110D.

In an embodiment, the connector hole 108 may accommodate a connector. The connector hole 108 may be disposed in the third surface 110C of the housing 110. For example, the connector hole 108 may be disposed in the third surface 110C so as to be adjacent to at least part of the audio module (e.g., the microphone hole 103 and the speaker hole 107). In another embodiment, the electronic device 100 may include the first connector hole 108 capable of accommodating a connector (e.g., a USB connector) for transmitting/receiving power and/or data with an external electronic device, and/or a second connector hole (not illustrated) capable of accommodating a connector (e.g., an earphone jack) for transmitting/receiving audio signals with an external electronic device.

In an embodiment, the electronic device 100 may include the light emitting element (not illustrated). For example, the light emitting element (not illustrated) may be disposed on the first surface 110A of the housing 110. The light emitting element (not illustrated) may provide state information of the electronic device 100 in the form of light. In another embodiment, the light emitting element (not illustrated) may provide a light source that operates in conjunction with operation of the camera module 105. For example, the light emitting element (not illustrated) may include an LED, an IR LED, and/or a xenon lamp.

Figure 3:
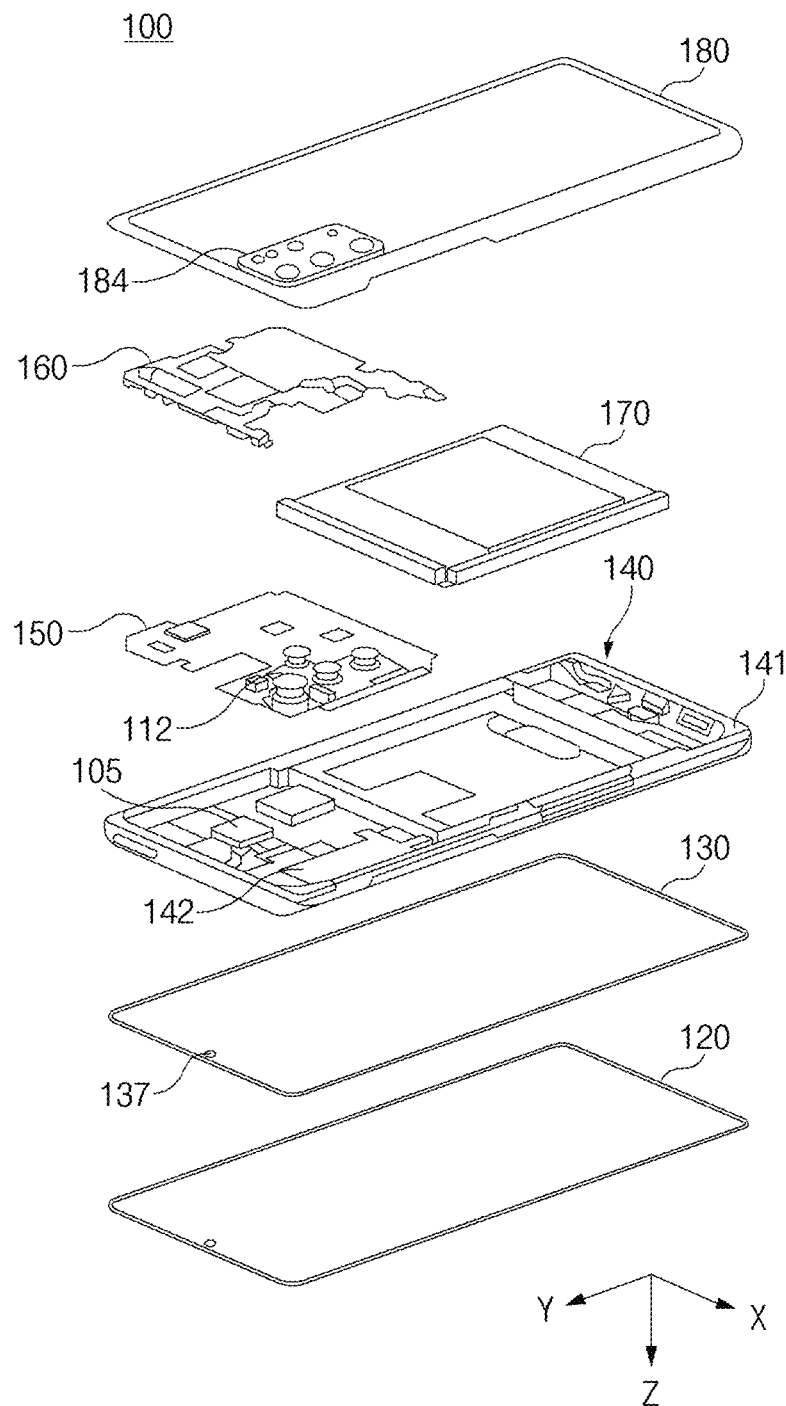
FIG. 3 is an exploded perspective view of the electronic device according to an embodiment.

FIG. 3 is an exploded perspective view of the electronic device 100 according to an embodiment.

Referring to FIG. 3, the electronic device 100 according to an embodiment may include a front plate 120 (e.g., the front plate 102 of FIG. 10), a display 130 (e.g., the display 101 of FIG. 1), a side member 140 (e.g., the side bezel structure 118 of FIG. 1), a printed circuit board 150, a rear case 160, a battery 170, a back plate 180 (e.g., the back plate 111 of FIG. 2), and an antenna (not illustrated).

In various embodiments, the electronic device 100 may not include at least one component (e.g., the rear case 160) among the aforementioned components, or may additionally include other component(s). Some of the components of the electronic device 100 illustrated in FIG. 3 may be identical or similar to some of the components of the electronic device illustrated in FIGS. 1 and 2 (e.g., the electronic device 100 of FIGS. 1 and 2), and repetitive descriptions will hereinafter be omitted.

In an embodiment, the front plate 120 and the display 130 may be coupled to the side member 140. For example, the front plate 120 and the display 130 may be disposed under the side member 140 with respect to FIG. 3. The front plate 120 and the display module 130 may be located in the +z-axis direction from the side member 140. For example, the display 130 may be coupled to the bottom of the side member 140, and the front plate 120 may be coupled to the bottom of the display 130. The front plate 120 may form part of the outer surface (or the exterior) of the electronic device 100. The display 130 may be disposed between the front plate 120 and the side member 140 so as to be located inside the electronic device 100.

In an embodiment, the side member 140 may be disposed between the display module 130 and the back plate 180. For example, the side member 140 may be configured to surround a space between the back plate 180 and the display 130.

In an embodiment, the side member 140 may include a frame structure 141 forming part of a side surface (e.g., the third surface 110C of FIG. 1) of the electronic device 100 and a plate structure 142 extending inward from the frame structure 141.

In an embodiment, the plate structure 142 may be disposed inside the frame structure 141 so as to be surrounded by the frame structure 141. The plate structure 142 may be connected with the frame structure 141, or may be integrally formed with the frame structure 141. The plate structure 142 may be formed of a metallic material and/or a nonmetallic (e.g., polymer) material. In an embodiment, the plate structure 142 may support other components included in the electronic device 100. For example, at least one of the display 130, the printed circuit board 150, the rear case 160, or the battery 170 may be disposed on the plate structure 142. For example, the display 130 may be coupled to one surface (e.g., the surface facing the +z-axis direction) of the plate structure 142, and the printed circuit board 150 may be coupled to a surface (e.g., the surface facing the −z-axis direction) facing away from the one surface.

In an embodiment, the rear case 160 may be disposed between the back plate 180 and the plate structure 142. The rear case 160 may be coupled to the side member 140 so as to overlap at least part of the printed circuit board 150. For example, the rear case 160 may face the plate structure 142 with the printed circuit board 150 therebetween.

In an embodiment, a processor (e.g., a processor 520 of FIG. 19), a memory (e.g., a memory 530 of FIG. 19), and/or an interface (e.g., an interface 577 of FIG. 19) may be mounted on the printed circuit board 150. The processor may include, for example, one or more of a central processing unit, an application processor, a graphic processing unit, an image signal processor, a sensor hub processor, or a communication processor. The memory may include, for example, a volatile memory or a nonvolatile memory. The interface may include, for example, a high definition multimedia interface (HDMI), a universal serial bus (USB) interface, an SD card interface, and/or an audio interface. The interface may electrically or physically connect the electronic device 100 with an external electronic device and may include a USB connector, an SD card/MMC connector, or an audio connector.

In an embodiment, the battery 170 (e.g., a battery 589 of FIG. 19) may supply power to at least one component of the electronic device 100. For example, the battery 170 may include a primary cell that is not rechargeable, a secondary cell that is rechargeable, or a fuel cell. At least part of the battery 170 may be disposed on substantially the same plane as the printed circuit board 150. The battery 170 may be integrally disposed inside the electronic device 100, or may be disposed so as to be detachable from the electronic device 100.

In an embodiment, the antenna (not illustrated) (e.g., an antenna module 597 of FIG. 19) may be disposed between the back plate 180 and the battery 170. The antenna (not illustrated) may include, for example, a near field communication (NFC) antenna, a wireless charging antenna, and/or a magnetic secure transmission (MST) antenna. For example, the antenna (not illustrated) may perform short-range communication with an external device, or may wirelessly transmit and receive power required for charging.

In an embodiment, the first camera module 105 may be disposed on at least part (e.g., the plate structure 142) of the side member 140 such that a lens receives external light through a partial area of the front plate 120 (e.g., the front surface 110A of FIG. 1). For example, the lens of the first camera module 105 may be visually exposed through a partial area (e.g., a camera area 137) of the front plate 120.

In an embodiment, the second camera module 112 may be disposed on the printed circuit board 150 such that a lens receives external light through a camera area 184 of the back plate 180 (e.g., the rear surface 110B of FIG. 2) of the electronic device 100. For example, the lens of the second camera module 112 may be visually exposed through the camera area 184. In an embodiment, the second camera module 112 may be disposed in at least part of an inner space formed in the housing (e.g., the housing 110 of FIGS. 1 and 2) of the electronic device 100 and may be electrically connected to the printed circuit board 150 through a connecting member (e.g., a connector).

In an embodiment, the camera area 184 may be formed in a surface (e.g., the rear surface 110B of FIG. 2) of the back plate 180. In an embodiment, the camera area 184 may be formed to be at least partially transparent such that external light is incident on the lens of the second camera module 112. In an embodiment, at least part of the camera area 184 may protrude to a predetermined height from the surface of the back plate 180. However, without being necessarily limited thereto, the camera area 184 may form substantially the same plane as the surface of the back plate 180.

Figure 4:
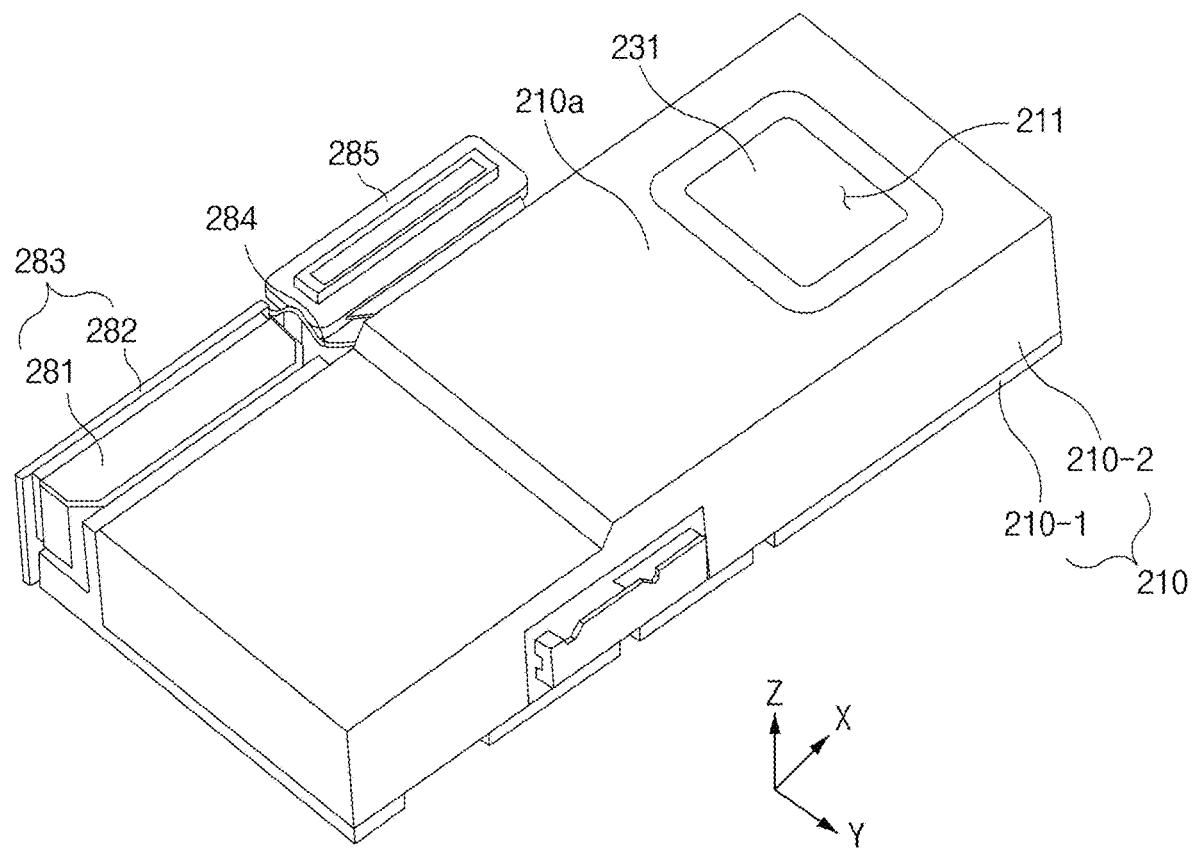
FIG. 4 is a perspective view of a camera module according to an embodiment.
Figure 5:
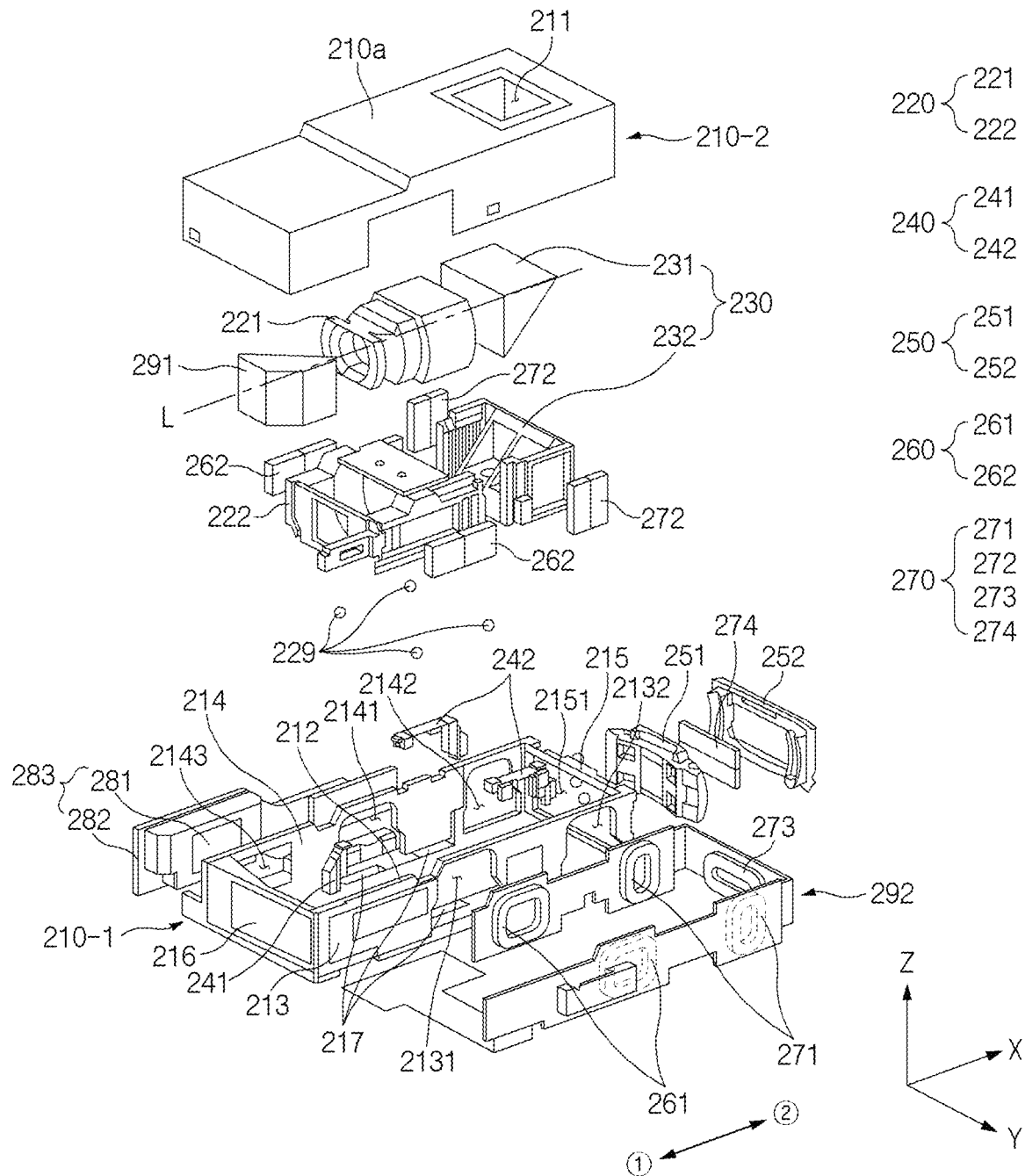
FIG. 5 is an exploded perspective view of the camera module according to an embodiment.

FIG. 4 is a perspective view of a camera module 200 according to an embodiment. FIG. 5 is an exploded perspective view of the camera module 200 according to an embodiment.

Referring to FIGS. 4 and 5, the camera module 200 according to an embodiment (e.g., the first camera module 105 or the second camera module 112 of FIGS. 1 to 3) may include a camera housing 210, a lens assembly 220, a reflective member assembly 230, a guide structure 250, a stopper member 240, a first drive member 260, a second drive member 270, a sensor assembly 283, a second reflective member 291, and a flexible circuit board 292.

In an embodiment, the camera housing 210 may form at least part of the exterior of the camera module 200. For example, the surface of the camera housing 210 may form the outer surface or the exterior of the camera module 200. The other components of the camera module 200 may be accommodated in the camera housing 210.

In an embodiment, the camera housing 210 may include a first housing 210-1 and a second housing 210-2 coupled with the first housing 210-1. For example, the first housing 210-1 may be a lower housing or a frame, and the second housing 210-2 may be an upper housing or a cover. The camera housing 210 may be configured to provide a predetermined space, in which the other components of the camera module 200 are accommodated, through the coupling of the first housing 210-1 and the second housing 210-2. For example, the first housing 210-1 may form the lower surface (e.g., the surface facing the −z-axis direction) of the camera module 200, and the second housing 210-2 may form the upper surface (e.g., the surface facing the +z-axis direction) and the side surfaces (e.g., the surfaces facing the x-axis direction and the y-axis direction) of the camera module 200.

In an embodiment, the first housing 210-1, together with the second housing 210-2, may form the space in which the other components of the camera module 200 are accommodated. The first housing 210-1 may be formed in a form that is open at the top and may have a receiving space formed therein in which the lens assembly 220, the reflective member assembly 230, the second reflective member 291, and/or the guide structure 250 is disposed. For example, the receiving space of the first housing 210-1 may refer to a predetermined space surrounded by the bottom surface (e.g., a base 212) and the side surfaces (e.g., sidewalls 213, 214, 215, and 216) of the first housing 210-1. At least part of the receiving space may be covered by the second housing 210-2.

According to an embodiment, the other components of the camera module 200 may be supported on, or coupled to, the first housing 210-1. For example, the first housing 210-1 may be configured such that the lens assembly 220, the reflective member assembly 230, the second reflective member 291, and the guide structure 250 are disposed in the receiving space of the first housing 210-1 and the flexible circuit board 292, the sensor assembly 283, and the stopper member 240 are disposed on the sidewalls 213, 214, 215, and 216 of the first housing 210-1. For example, the guide structure 250, the reflective member assembly 230 (or a first reflective member 231), the lens assembly 220, and the second reflective member 291 may be sequentially disposed in a first optical axis direction ① in the receiving space.

In an embodiment, the first housing 210-1 may include the base 212 forming the bottom surface (e.g., the surface facing the z-axis direction) of the first housing 210-1 (or the camera module 200) and the plurality of sidewalls 213, 214, 215, and 216 extending from the edges of the base 212 in a direction (e.g., the +z-axis direction) perpendicular to the base 212.

In an embodiment, the lens assembly 220 may be disposed on the base 212 so as to be movable in the direction of an optical axis L. For example, a plurality of first balls 229 may be disposed between a lens carrier 222 of the lens assembly 220 and the base 212 to guide a movement of the lens assembly 220. In an embodiment, the base 212 may have first recesses 217 formed therein in which the plurality of first balls 229 are disposed. For example, partial areas of the base 212 may be recessed in the −z-axis direction to form the first recesses 217. The first recesses 217 may be formed in a shape extending in the direction of the optical axis L (e.g., the x-axis direction) by a predetermined length. For example, as many first recesses 217 as the plurality of first balls 229 may be formed. The plurality of first balls 229 may be configured to roll in the space between the lens carrier 222 and the base 212. For example, when the lens carrier 222 moves in the direction of the optical axis L, the plurality of first balls 229 may rotate while linearly moving in the direction of the optical axis L between the lens carrier 222 and the base 212, or may rotate in position.

In various embodiments, the camera module 200 may be configured to provide an auto focus (AF) function by moving the lens assembly 220 in the direction of the optical axis L by using the first drive member 260.

In an embodiment, the plurality of sidewalls 213, 214, 215, and 216 may include the first sidewall 213 parallel to the optical axis L, the second sidewall 214 facing the first sidewall 213 and parallel to the optical axis L, the third sidewall 215 facing a second optical axis direction ② (e.g., the +x-axis direction) and connecting the first sidewall 213 and the second sidewall 214, and the fourth sidewall 216 facing the first optical axis direction ① (e.g., the −x-axis direction) and connecting the first sidewall 213 and the second sidewall 214. For example, the third sidewall 215 may connect end portions (e.g., the end portions facing the second optical axis direction ② or the end portions facing the +x-axis direction) of the first sidewall 213 and the second sidewall 214, and the fourth sidewall 216 may connect end portions (e.g., the end portions facing the first optical axis direction ① or the end portions facing the −x-axis direction) of the first sidewall 213 and the second sidewall 214. For example, the third sidewall 215 and the fourth sidewall 216 may be substantially perpendicular to the first sidewall 213 and the second sidewall 214.

In an embodiment, the first housing 210-1 may be configured such that the flexible circuit board 292 and coils 261, 271, and 273 are disposed on at least some of the plurality of sidewalls 213, 214, 215, and 216. For example, at least some of the plurality of sidewalls 213, 214, 215, and 216 may be surrounded by the flexible circuit board 292, and the coils 261, 271, and 273 may be disposed on at least parts of the flexible circuit board 292.

In an embodiment, among the plurality of sidewalls 213, 214, 215, and 216, at least a part of the first sidewall 213, the second sidewall 214, and the third sidewall 215 may be surrounded by the flexible circuit board 292. Opening areas 2131, 2132, 2141, 2142, and 2151 may be formed in the first sidewall 213, the second sidewall 214, and the third sidewall 215 such that the plurality of coils 261, 271, and 273 are disposed therein. The plurality of coils 261, 271, and 273 may be located in the receiving space of the first housing 210-1 through the opening areas and may be disposed to face a plurality of magnets 262, 272, and 274 corresponding thereto. For example, the first sidewall 213 may have the first opening area 2131 in which the first coil 261 is located and the second opening area 2132 in which the second coil 271 is located. The second sidewall 214 may have the third opening area 2141 in which the first coil 261 is located and the fourth opening area 2142 in which the second coil 271 is located. The third sidewall 215 may have the fifth opening area 2151 in which the third coil 273 is located.

In an embodiment, the sensor assembly 283 may be disposed on the second sidewall 214 of the first housing 210-1. For example, a sixth opening area 2143 may be formed in the second sidewall 214, and the sensor assembly 283 may be disposed on the second sidewall 214 such that an image sensor 281 is aligned with the sixth opening area 2143. For example, the sensor assembly 283 may be disposed on the outside surface (e.g., the surface facing the −y-axis direction) of the second sidewall 214 such that the image sensor 281 faces toward the sixth opening area 2143. The image sensor 281 may partially overlap the sixth opening area 2143 when the second sidewall 214 is viewed from the front with respect to FIG. 5 (e.g., when the second sidewall 214 is viewed in the −y-axis direction). According to an embodiment, external light passing through the first reflective member 231 and a lens unit 221 may be incident on the image sensor 281 through the sixth opening area 2143 after refracted and/or reflected by the second reflective member 291.

In an embodiment, the second housing 210-2 may be coupled to an upper portion (e.g., the +z-axis direction) of the first housing 210-1. The second housing 210-2 may be formed in a form capable of covering at least part of the first housing 210-1. For example, the second housing 210-2 may be coupled to the upper portion of the first housing 210-1 to cover the receiving space.

In an embodiment, the second housing 210-2 may have a light receiving area 211 formed therein through which the first reflective member 231 is visually exposed. For example, the light receiving area 211 may be formed in a partial area of an upper surface 210a (e.g., the surface facing the +z-axis direction) of the second housing 210-2. For example, the light receiving area 211 may include an opening area (or a through-hole) formed in the upper surface of the second housing 210-2, or may include a transparent area. External light may move into the camera housing 210 through the light receiving area 211. The external light may be incident on the first reflective member 231, which is disposed inside the camera housing 210, through the light receiving area 211. For example, the light receiving area 211 may overlap the first reflective member 231 such that the external light is incident on the first reflective member 231. As illustrated in FIG. 4, at least part of the first reflective member 231 may be visually exposed outside the camera housing 210 through the light receiving area 211. For example, at least part of the first reflective member 231 may overlap the light receiving area 211 when the upper surface 210a of the second housing 210-2 is viewed from above.

In an embodiment, the lens assembly 220 may be disposed inside the camera housing 210. The lens assembly 220 may be configured to move in the direction of the optical axis L of the lens inside the camera housing 210. For example, the lens assembly 220 may linearly move in the first optical axis direction ① or the second optical axis direction ② in the receiving space of the first housing 210-1. In an embodiment, the optical axis L of the lens may be defined as the virtual axis extending in the direction in which external light passes through the lens. For example, the optical axis L may extend in substantially the x-axis direction.

In an embodiment, the lens assembly 220 may include the lens unit 221 and the lens carrier 222 in which at least part of the lens unit 221 is accommodated. The lens unit 221 may include one or more lenses, and at least some of the lenses may be accommodated in the lens carrier 222. The lens unit 221 may move together with the lens carrier 222. The lens carrier 222 may be disposed in the receiving space (e.g., on the base 212) of the first housing 210-1 so as to be movable in the direction of the optical axis L. The first magnets 262 electro-magnetically interacting with the first coils 261 may be disposed on the lens carrier 222. For example, the lens carrier 222 may be configured to move in the direction of the optical axis L by an electro-magnetic force generated between the first coils 261 and the first magnets 262. In another example, the lens carrier 222 may move in the direction of the optical axis in the camera housing 210 when the camera module 200 is in an unpowered state.

In an embodiment, the reflective member assembly 230 may be disposed inside the camera housing 210. For example, the reflective member assembly 230 may be located in the second optical axis direction ② with respect to the lens assembly 220. The reflective member assembly 230 may be configured to reflect or refract external light incident through the light receiving area 211. For example, light incident on the reflective member assembly 230 in a direction (e.g., the z-axis direction) perpendicular to the optical axis L through the light receiving area 211 may be reflected and/or refracted by the first reflective member 231 and may be incident on the lens unit 221 in the direction of the optical axis L.

In an embodiment, the reflective member assembly 230 may include the first reflective member 231 and a holder 232 in which at least part of the first reflective member 231 is accommodated. The first reflective member 231 may reflect and/or refract external light to direct the external light toward the lens assembly 220. For example, the first reflective member 231 may include a mirror or prism that has an inclined surface. The first reflective member 231 may be disposed in the holder 232. For example, the first reflective member 231 may be coupled to the holder 232 so as to move or rotate together with the holder 232.

In an embodiment, the holder 232 may be configured to rotate about a virtual axis of rotation relative to the first housing 210-1. The virtual axis of rotation may be substantially perpendicular to the optical axis L. For example, the holder 232 may rotate in a predetermined range about a virtual first axis of rotation (e.g., a first axis of rotation R1 of FIG. 9) substantially parallel to the z-axis. Furthermore, the holder 232 may rotate in a predetermined range about a virtual second axis of rotation (e.g., the second axis of rotation R2 of FIG. 9) substantially parallel to the y-axis.

In an embodiment, the guide structure 250 for guiding rotation of the reflective member assembly 230 may be coupled to the holder 232.

In an embodiment, the guide structure 250 may include a first guide member 251 coupled with the holder 232 and a second guide member 252 coupled with the first guide member 251. For example, the holder 232 may be coupled to the first guide member 251 so as to be rotatable about an axis of rotation (e.g., the first axis of rotation R1 of FIG. 9). For example, the first guide member 251 may be coupled to the second guide member 252 so as to be rotatable about an axis of rotation (e.g., the second axis of rotation R2 of FIG. 9). The holder 232 may be coupled to rotate together when the first guide member 251 rotates relative to the second guide member 252. For example, the reflective member assembly 230 may rotate relative to the first guide member 251 when rotating about the first axis of rotation R1 and may rotate relative to the first guide member 251 and the second guide member 252 when rotating about the second axis of rotation R2. The coupling relationship between the reflective member assembly 230 and the guide structure 250 will be described below with reference to FIGS. 9 to 11.

In an embodiment, the second magnets 272 electro-magnetically interacting with the second coils 271 may be disposed on the holder 232. For example, the holder 232 may be configured to rotate about an axis of rotation parallel to the z-axis by an electro-magnetic force generated between the second coils 271 and the second magnets 272. The third magnet 274 electro-magnetically interacting with the third coil 273 may be disposed on the first guide member 251. For example, the first guide member 251 may be configured to rotate about an axis of rotation parallel to the y-axis by an electro-magnetic force generated between the third coil 273 and the third magnet 274.

In various embodiments, the camera module 200 may rotate the reflective member assembly 230 about an axis of rotation perpendicular to the optical axis L by using the second drive member 270, thereby providing an optical image stabilizer (OIS) function in response to external noise (e.g., a camera-shake) applied to the camera module 200. For example, the camera module 200 may compensate for a shake of an image by changing the angle of light incident toward the lens assembly 220 by rotating the first reflective member 231 in a predetermined range.

In an embodiment, the stopper member 240 may limit a movement range of the lens assembly 220 in the direction of the optical axis. For example, the stopper member 240 may limit a movement of the lens assembly 220 in the direction of the optical axis by contact of at least part of the stopper member 240 with the lens assembly 220. The stopper member 240 may be configured to provide damping for movement in the optical axis L direction of the lens assembly 220. Furthermore, at least part of the stopper member 240 may be formed of an elastic material to absorb and/or alleviate an impact when the lens assembly 220 makes contact with the stopper member 240. The stopper member 240 may limit the movement range of the lens assembly 220 and, at the same time, provide a damping force when in contact with the lens assembly 220, thereby acting as a damping action.

In an embodiment, the stopper member 240 may include a first stopper member 241 that limits a movement of the lens assembly 220 in the first optical axis direction ① and second stopper members 242 that limit a movement of the lens assembly 220 in the second optical axis direction ②. The first stopper member 241 may be coupled to the first sidewall 213 of the first housing 210-1. The second stopper members 242 may be coupled to the first sidewall 213 and/or the second sidewall 214 of the first housing 210-1. For example, the first stopper member 241 may be configured to make contact with the lens assembly 220 when the lens assembly 220 moves a specified distance in the first optical axis direction ①. The second stopper members 242 may be configured to make contact with the lens assembly 220 when the lens assembly 220 moves a specified distance in the second optical axis direction ②. The first stopper member 241 may provide damping when the lens assembly 220 moves in the first optical axis direction ① and makes contact or collision. The second stopper member 242 may provide damping when the lens assembly 220 moves in the second optical axis direction ② and makes contact or collision. The shape and function of the stopper member 240 will be described below with reference to FIGS. 6A to 8.

In an embodiment, the first drive member 260 may provide a driving force to move the lens assembly 220 in the direction of the optical axis L. The first drive member 260 may include the first coils 261 disposed on one of the camera housing 210 (e.g., the first housing 210-1) and the lens assembly 220, and the first magnets 262 disposed on the other one of the camera housing 210 and the lens assembly 220. According to the embodiment illustrated in FIG. 5, the first coils 261 may be disposed on sidewalls (e.g., the first sidewall 213 and the second sidewall 214) of the first housing 210-1, and the first magnets 262 may be disposed on the lens carrier 222 to face the first coils 261. However, the position of the first drive member 260 is not limited to the illustrated embodiment. In another embodiment, the first coils 261 may be disposed on the lens carrier 222, and the first magnets 262 may be disposed on the first housing 210-1.

In an embodiment, the camera module 200 may control the position of the lens assembly 220 in the direction of the optical axis L by controlling an electric current flowing through the first coils 261. For example, the first magnets 262 and the first coils 261 may electro-magnetically interact with each other. For example, the first coils 261 may be located in a magnetic field formed by the first magnets 262. In an embodiment, the processor (e.g., the processor 520 of FIG. 19 and/or an image signal processor 660 of FIG. 20) may control the direction and/or strength of the electric current passing through the first coils 261. An electro-magnetic force (e.g., Lorentz force) may be applied to the first magnets 262 to correspond to the direction of the electric current passing through the first coils 261. The lens assembly 220 may move in the direction of the optical axis L of the lens by the electro-magnetic force. In an embodiment, the second reflective member 291 and the image sensor 281 may be fixedly disposed in the first housing 210-1, and the lens assembly 220 may move in the direction of the optical axis L between the reflective member assembly 230 and the second reflective member 291. Accordingly, the distance between the lens assembly 220 and the second reflective member 291 may be changed, and the travel distance of light that passes through the lens and that is reflected by the second reflective member 291 and directed toward the image sensor 281 may be varied.

In an embodiment, the second drive member 270 may provide a driving force to rotate the reflective member assembly 230 about an axis of rotation perpendicular to the optical axis L. For example, the second drive member 270 may include the second magnets 272 and the second coils 271 for rotating the reflective member assembly 230 about an axis of rotation parallel to the z-axis, and the third magnet 274 and the third coil 273 for rotating the reflective member assembly 230 about an axis of rotation parallel to the y-axis. For example, the second magnets 272 and the second coils 271 may electro-magnetically interact with each other. For example, the third magnet 274 and the third coil 273 may electro-magnetically interact with each other. The rotary motion of the reflective member assembly 230 by the second drive member 270 will be described below with reference to FIGS. 9 to 11.

In an embodiment, the second coils 271 may be disposed on one of the camera housing 210 (e.g., the first housing 210-1) and the reflective member assembly 230, and the second magnets 272 may be disposed on the other one of the camera housing 210 and the reflective member assembly 230. In an embodiment, the third coil 273 may be disposed on one of the camera housing 210 and the first guide member 251, and the third magnet 274 may be disposed on the other one of the camera housing 210 and the first guide member 251. According to the embodiment illustrated in FIG. 5, the second coils 271 and the third coil 273 may be disposed on sidewalls (e.g., the first sidewall 213, the second sidewall 214, and the third sidewall 215) of the first housing 210-1, the second magnets 272 may be disposed on the holder 232 to face the second coils 271, and the third magnet 274 may be disposed on the first guide member 251 to face the third coil 273. However, the position of the second drive member 270 is not limited to the illustrated embodiment. In another embodiment, the second magnets 272 and the third magnet 274 may be disposed on the first housing 210-1, the second coils 271 may be disposed on the holder 232, and the third coil 273 may be disposed on the first guide member 251.

In an embodiment, the sensor assembly 283 may be disposed on the second sidewall 214 of the first housing 210-1. The sensor assembly 283 may include the image sensor 281 and a sensor circuit board 282 to which the image sensor 281 is electrically connected. The image sensor 281 may be aligned with the sixth opening area 2143, which is formed in the second sidewall 214 of the first housing 210-1, such that light reflected or refracted by the second reflective member 291 is incident on the image sensor 281. For example, the image sensor 281 may be disposed to face one surface of the second reflective member 291 through the sixth opening area 2143. The image sensor 281 may be configured to receive light that passes through the lens and that is reflected by the second reflective member 291 and generate an electrical signal based on the received optical signal. The sensor circuit board 282 may be electrically connected with a connector 285, and the connector 285 may be electrically connected to a printed circuit board (e.g., the printed circuit board 150 of FIG. 3) of an electronic device (e.g., the electronic device 100 of FIGS. 1 to 3). For example, the sensor circuit board 282 may be electrically connected with the connector 285 through a connecting member 284 (e.g., a flexible circuit board or a cable).

In an embodiment, the second reflective member 291 may change the travel path of external light passing through the lens. The second reflective member 291 may be located in the first optical axis direction ① with respect to the lens assembly 220. For example, the second reflective member 291 may direct, toward the image sensor 281, external light passing through the lens and travelling in the first optical axis direction ①, by reflecting or refracting the external light in a direction (e.g., the −y-axis direction) perpendicular to the first optical axis direction ①. For example, the second reflective member 291 may include a mirror or prism that has an inclined surface. In another embodiment, the camera module 200 may not include the second reflective member 291. When the second reflective member 291 is omitted as in the other embodiment, the position of the image sensor 281 may be changed to be aligned with the lens assembly 220 in the direction of the optical axis L.

In an embodiment, the flexible circuit board 292 may surround some of the sidewalls 213, 214, 215, and 216 of the first housing 210-1. The first coils 261, the second coils 271, and the third coil 273 may be disposed on the flexible circuit board 292. For example, the flexible circuit board 292 may surround the first sidewall 213, the second sidewall 214, and the third sidewall 215 of the first housing 210-1 such that the first coils 261 and the second coils 271 are located in the first sidewall 213 (e.g., the first opening area 2131 and the second opening area 2132) and the second sidewall 214 (e.g., the third opening area 2141 and the fourth opening area 2142) and the third coil 273 is located in the third sidewall 215 (e.g., the fifth opening area 2151). In an embodiment, the flexible circuit board 292 may be electrically connected with the printed circuit board (e.g., the printed circuit board 150 of FIG. 3) of the electronic device (e.g., the electronic device 100 of FIGS. 1 to 3). The flexible circuit board 292 may include a flexible printed circuit board (FPCB) or a rigid-flexible printed circuit board (RFPCB).

Figure 6A:
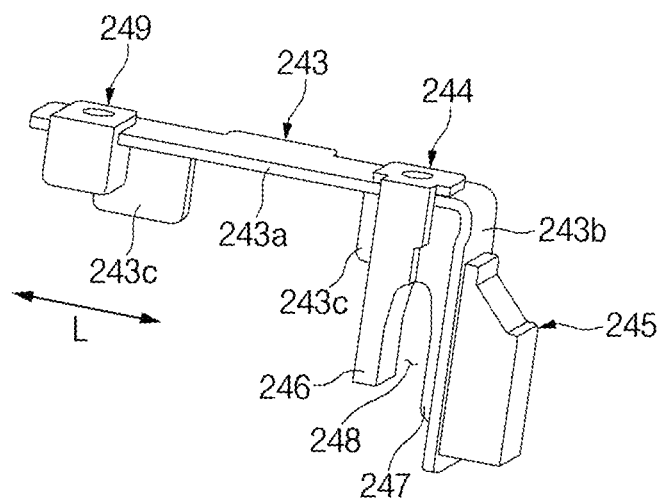
FIG. 6A is a view illustrating a stopper member of the camera module according to an embodiment.
Figure 6B:
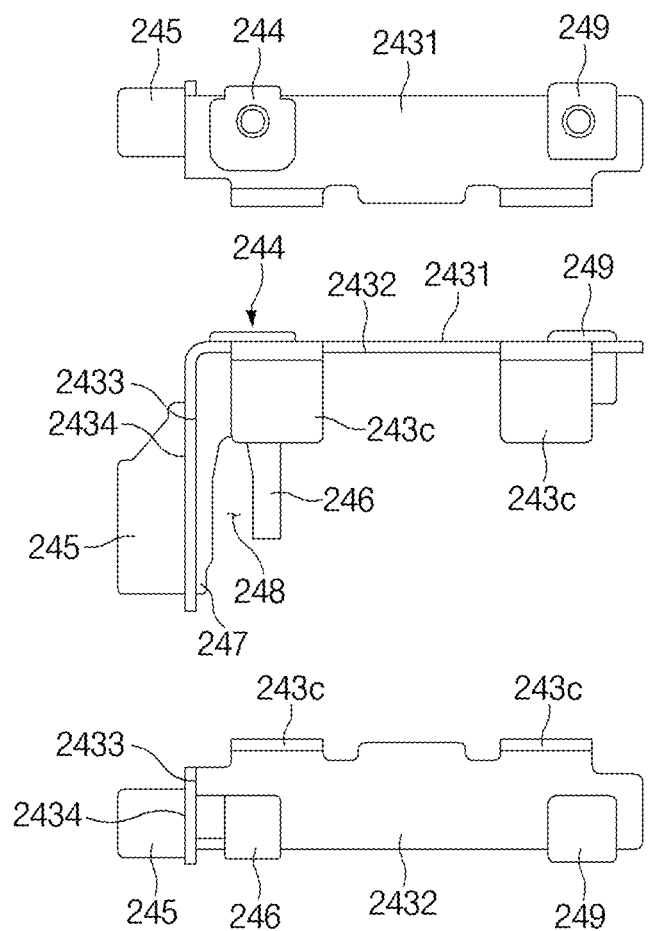
FIG. 6B is a view illustrating the stopper member of the camera module according to an embodiment.

FIG. 6A is a view illustrating the stopper member 240 of the camera module 200 according to an embodiment. FIG. 6B is a view illustrating the stopper member 240 of the camera module 200 according to an embodiment.

Referring to FIGS. 6A and 6B, the stopper member 240 of the camera module 200 according to an embodiment may include a base part 243 and stopper parts 244, 245, and 249 coupled to the base part 243. The stopper parts 244, 245, and 249 may include the linear stopper 244, the buffer stopper 245, and the rotational stopper 249. For example, a first stopper member (e.g., the first stopper member 241 of FIG. 5) and second stopper members (e.g., the second stopper members 242 of FIG. 5) may be formed in the same shape, and components of the first stopper member 241 and components of the second stopper members 242 may be the same as each other.

In an embodiment, the stopper parts 244, 245, and 249 may be coupled to the base part 243. The base part 243 may be a part coupled with the camera housing 210 such that the stopper member 240 is fixed to a camera housing (e.g., the camera housing 210 of FIGS. 4 and 5). For example, the base part 243 may be fixedly coupled to a first housing (e.g., the first camera housing 210-1 of FIGS. 4 and 5). In an embodiment, the base part 243 may have a predetermined rigidity to stably support the stopper parts 244, 245, and 249 without a change in shape or position when an external force or impact is applied to the stopper parts 244, 245, and 249. The base part 243 may be formed of various materials having rigidity higher than or equal to a predetermined level. For example, the base part 243 may be formed of steel use stainless (SUS). However, without being limited thereto, the base part 243 may be formed of various materials.

In an embodiment, the base part 243 may be formed of a material having a higher rigidity than the stopper parts 244, 245, and 249. For example, the base part 243 may be formed of a hard material, and the stopper parts 244, 245, and 249 may be formed of a soft material. In various embodiments, the stopper member 240 may be implemented such that the base part 243 and the stopper parts 244, 245, and 249 are integrally formed with one another through an insert molding process. However, a manufacturing process for the stopper member 240 is not limited to the insert molding, and the stopper member 240 may be manufactured through various manufacturing processes. In another example, the stopper member 240 may be assembled as one component by manufacturing the base part 243 and the stopper parts 244, 245, and 249 through separate processes and thereafter bonding the stopper parts 244, 245, and 249 to the base part 243 or fitting the stopper parts 244, 245, and 249 into the base part 243.

In an embodiment, the base part 243 may include a first portion 243a extending in the direction of the optical axis L, a second portion 243b substantially vertically extending from one end of the first portion 243a that faces the long-side direction (e.g., the direction of the optical axis L), and third portions 243c substantially vertically extending from one end of the first portion 243a that faces the short-side direction. The rotational stopper 249 may be disposed on part of the first portion 243a. The linear stopper 244 and the buffer stopper 245 may be disposed on part of the first portion 243a and part of the second portion 243b.

In an embodiment, the linear stopper 244 may be disposed on a first surface 2433 of the second portion 243b, and the buffer stopper 245 may be disposed on a second surface 2434 of the second portion 243b. For example, the first surface 2433 of the second portion 243b may be defined as the surface facing toward the rotational stopper 249, and the second surface 2434 of the second portion 243b may be defined as the surface facing away from the first surface 2433 of the second portion 243b. For example, the first surface 2433 of the second portion 243b may be construed as the surface facing toward an opposite end of the first portion 243a in the long-side direction. In various embodiments, the linear stopper 244 and the buffer stopper 245 may be integrally formed through an insert molding process and may be formed to pass through at least parts of the second portion 243b. However, a manufacturing method for the linear stopper 244 and the buffer stoppers 245 is not limited to the described contents. In another example, the linear stopper 244 and the buffer stopper 245 may be manufactured as separate components and may be bonded to the first surface 2433 and the second surface 2434 of the second portion 243b. In various embodiments, the linear stopper 244 and the buffer stopper 245 may contain an elastic material, a flexible material, or an injection material. For example, the linear stopper 244 and the buffer stopper 245 may be formed of various materials including rubber, urethane, Poron, and sponge. In various embodiments, the linear stopper 244 and the buffer stopper 245 may be formed of the same material, or may be formed of different materials.

In an embodiment, at least part of the linear stopper 244 may be formed to pass through part of the first portion 243a. For example, the linear stopper 244 may extend from a partial area of a first surface 2431 of the first portion 243a through the first portion 243a toward a second surface 2432 of the first portion 243a. For example, the linear stopper 244 may extend in substantially the same direction as the direction in which the second portion 243b extends from the first portion 243a.

In an embodiment, the linear stopper 244 may be configured to be brought into contact with, or spaced apart from, the lens assembly 220 as the lens assembly (e.g., the lens assembly 220 of FIG. 5) moves in the direction of the optical axis L. For example, the linear stopper 244 may provide a function of limiting a movement of the lens assembly 220, by making contact with the lens assembly 220. Furthermore, the linear stopper 244 may provide the function of a damper capable of absorbing or dissipating an impact when the lens assembly 220 makes contact with, or collides with, the linear stopper 244. For example, to provide the function of the damper, the linear stopper 244 may be formed of an elastic material or a flexible material.

In an embodiment, the linear stopper 244 may have a recess 248 formed in at least part thereof. For example, the linear stopper 244 may be configured such that due to the recess 248, one portion (e.g., a flexible portion 246) moves (or elastically deforms) in a direction toward or away from another portion (e.g., a fixed portion 247). In an embodiment, the linear stopper 244 may include the flexible portion 246 and the fixed portion 247 facing each other with the recess 248 therebetween. For example, the fixed portion 247 may be fixed to the first surface 2433 of the second portion 243b, and the flexible portion 246 may extend from the fixed portion 247 and may be spaced apart from the fixed portion 247 by a predetermined gap. In various embodiments, the linear stopper 244 may be configured such that when an external force is applied to the flexible portion 246, the flexible portion 246 deforms in the direction toward the fixed portion 247 and when the external force is removed, the flexible portion 246 deforms in the direction away from the fixed portion 247. Accordingly, the linear stopper 244 may absorb and/or dissipate an impact through deformation or movement of the linear stopper 244 (e.g., the flexible portion 246) when an external force is applied to the linear stopper 244.

In an embodiment, the rotational stopper 249 may be configured to prevent rotation of the lens assembly (e.g., the lens assembly 220 of FIG. 5). The rotational stopper 249 may pass through the first surface 2431 of the first portion 243a and may extend toward the second surface 2432 of the first portion 243a. When the lens assembly 220 rotates, the rotational stopper 249 may limit the rotation of the lens assembly 220 by making contact with part of the lens assembly 220. Furthermore, the rotational stopper 249 may be formed of an elastic material (or a flexible material) to prevent damage when the lens assembly 220 makes contact with the rotational stopper 249. In various embodiments, the rotational stopper 249 may be formed of substantially the same material as the linear stopper 244 or the buffer stopper 245.

Hereinafter, an operation of limiting a movement range of the lens assembly 220 in the direction of the optical axis L by the stopper member 240, an operation of preventing rotation of the lens assembly 220, and an operation of absorbing and/or alleviating an impact (or noise) caused by a movement of the lens assembly 220 will be described with reference to FIGS. 7 and 8.

Figure 7:
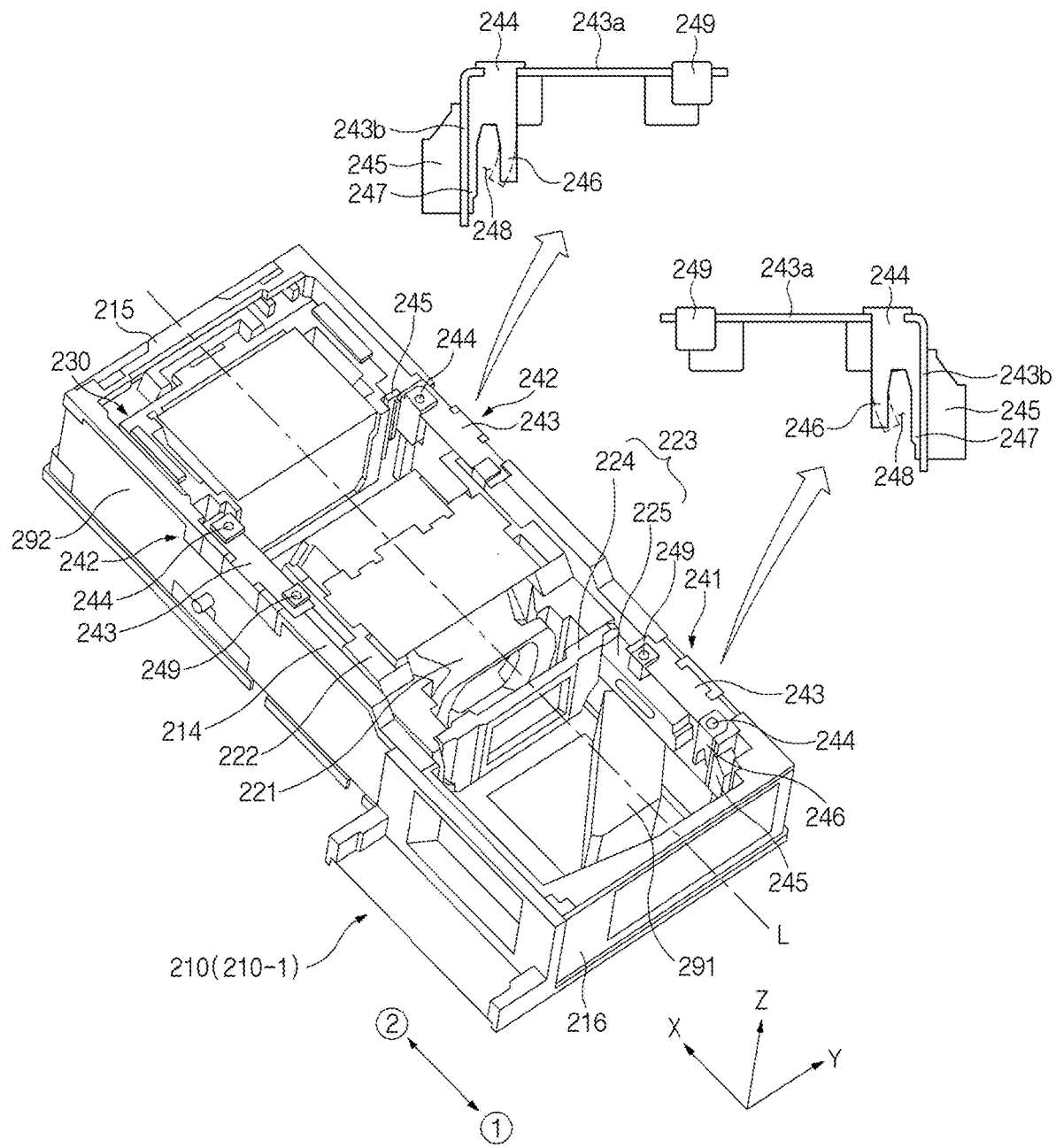
FIG. 7 is a view illustrating operations of a lens assembly and the stopper member of the camera module according to an embodiment.

FIG. 7 is a view illustrating operations of the lens assembly 220 and the stopper members 241 and 242 of the camera module 200 according to an embodiment. FIG. 8 is a view illustrating operations of the lens assembly 220 and the stopper members 241 and 242 of the camera module 200 according to an embodiment.

FIG. 7 is a perspective view of the camera module 200 according to an embodiment. For example, FIG. 7 may be a view in which a second housing (e.g., the second housing 210-2 of FIGS. 4 and 5) and the sensor assembly 283 of the camera module 200 are omitted. FIG. 8 is a plan view of the camera module 200 according to an embodiment. For example, FIG. 8 may be a view of the camera module 200 illustrated in FIG. 7 as viewed in the −z-axis direction.

Figure 8:
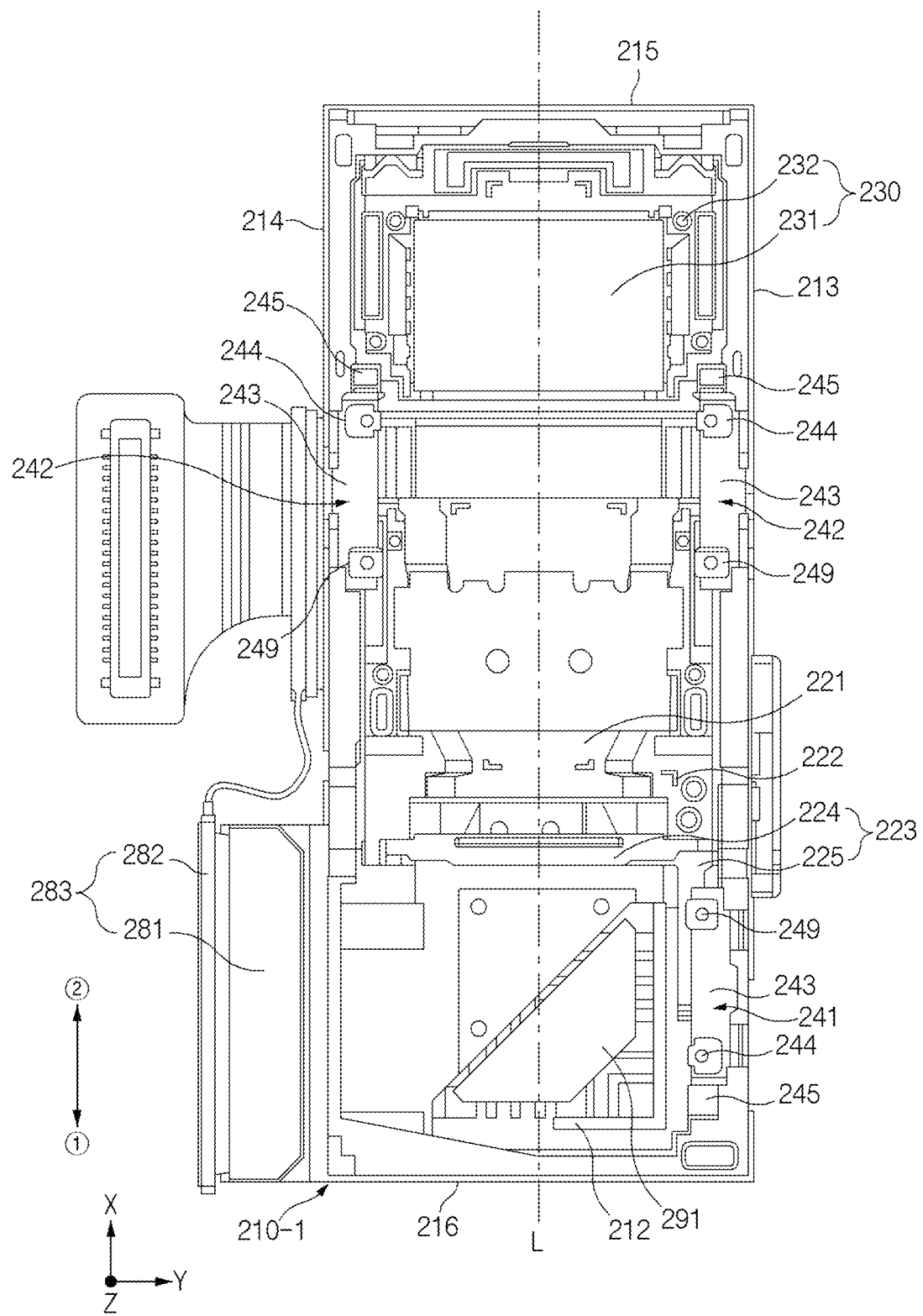
FIG. 8 is a view illustrating operations of the lens assembly and the stopper member of the camera module according to an embodiment.

Referring to FIGS. 7 and 8, the camera module 200 according to an embodiment may include the first housing 210-1, the lens assembly 220, the reflective member assembly 230, the stopper members 241 and 242, the sensor assembly 283, the second reflective member 291, and the flexible circuit board 292. Some of the components of the camera module 200 illustrated in FIGS. 7 and 8 are identical or similar to the components of the camera module 200 described above with reference to FIGS. 4 to 6B, and therefore repetitive descriptions will hereinafter be omitted.

In an embodiment, the first housing 210-1 may accommodate the reflective member assembly 230, the lens assembly 220, and the second reflective member 291 inside. According to the embodiment illustrated in FIGS. 7 and 8, the reflective member assembly 230, the lens assembly 220, and the second reflective member 291 may be sequentially disposed in the first housing 210-1 in the first optical axis direction ①. For example, the reflective member assembly 230 may be located in the second optical axis direction ② with respect to the lens assembly 220, and the second reflective member 291 may be located in the first optical axis direction ① with respect to the lens assembly 220.

In an embodiment, the stopper members 241 and 242 may be coupled to at least some of the sidewalls 213, 214, 215, and 216 of the first housing 210-1. The stopper members 241 and 242 may be coupled to the sidewalls (the first sidewall 213 and the second sidewall 214) parallel to the optical axis L among the sidewalls 213, 214, 215, and 216 of the first housing 210-1. For example, the stopper members 241 and 242 may be coupled to the first sidewall 213 and the second sidewall 214 of the first housing 210-1.

In an embodiment, the lens assembly 220 may be configured to move in the direction of the optical axis L. For example, the lens assembly 220 may linearly move in the first optical axis direction ① or the second optical axis direction ②. As the lens assembly 220 moves in the first optical axis direction ①, the distance between the lens assembly 220 and the second reflective member 291 in the direction of the optical axis L may decrease. As the lens assembly 220 moves in the second optical axis direction ②, the distance between the lens assembly 220 and the reflective member assembly 230 in the direction of the optical axis L may decrease.

In an embodiment, the lens assembly 220 may include the lens carrier 222, the lens unit 221, at least part of which is accommodated in the lens carrier 222, and a fixing member 223 coupled to an end portion of the lens carrier 222 that faces the first optical axis direction ①. The lens unit 221 and the fixing member 223 may move in the direction of the optical axis L together with the lens carrier 222. In an embodiment, the fixing member 223 may include a coupling portion 224 coupled to the lens carrier 222 and an extending portion 225 extending from the coupling portion 224. For example, the extending portion 225 may extend toward the fourth sidewall 216 of the first housing 210-1 from an edge area of the coupling portion 224 that is adjacent to the first sidewall 213 of the first housing 210-1. The extending portion 225 may extend from the coupling portion 224 toward the first stopper member 241. For example, the extending portion 225 may extend in the first optical axis direction ① by a specified length. For example, the fixing member 223 may be a component to which a baffle (not illustrated) is coupled. In various embodiments, the lens assembly 220 may not include the fixing member 223. Furthermore, in various embodiments, the fixing member 223 may not include the extending portion 225.

In an embodiment, the lens assembly 220 may be configured to be brought into contact with, or spaced apart from, at least a part (e.g., the linear stopper 244) of the stopper members 241 and 242 as the lens assembly 220 moves in the direction of the optical axis L. For example, the lens assembly 220 may be configured such that the extending portion 225 of the fixing member 223 makes contact with the first stopper member 241 when the lens assembly 220 moves in the first optical axis direction ① and an end portion of the lens carrier 222 in the second optical axis direction 2 makes contact with the second stopper members 242 when the lens assembly 220 moves in the second optical axis direction ②.

According to the illustrated embodiment, as the extending portion 225 of the fixing member 223 is configured to make contact with the first stopper member 241, the lens assembly 220 may prevent contact and/or collision with the second reflective member 291 when the lens assembly 220 moves in the first optical axis direction ①. For example, the extending portion 225 of the fixing member 223 may be brought into contact with, or spaced apart from, the first stopper member 241 while moving in the direction of the optical axis L between one surface of the second reflective member 291 and the first sidewall 213 of the first housing 210-1. However, the illustrated embodiment is illustrative, and in another embodiment, the camera module 200 may not include the second reflective member 291. In the other embodiment, the fixing member 223 or the extending portion 225 of the fixing member 223 may be omitted. For example, when the camera module 200 does not include the second reflective member 291, the lens assembly 220 may be configured such that the lens carrier 222 makes direct contact with the first stopper member 241 or the coupling portion 224 of the fixing member 223 makes contact with the first stopper member 241. For example, when the fixing member 223 or the extending portion 225 of the fixing member 223 is omitted, the first stopper member 241 may be coupled to the first sidewall 213 so as to be located adjacent to the lens carrier 222 or the coupling portion 224 of the fixing member 223.

In an embodiment, the stopper members 241 and 242 may be coupled to sidewalls (e.g., the first sidewall 213 and the second sidewall 214) of the first housing 210-1. For example, the stopper members 241 and 242 may include the first stopper member 241, at least part of which is located between the fourth sidewall 216 of the first housing 210-1 and the lens assembly 220, and the second stopper members 242, at least parts of which are located between the reflective member assembly 230 and the lens assembly 220. In an embodiment, the first stopper member 241 may be coupled to the first sidewall 213 of the first housing 210-1. The second stopper members 242 may be coupled to the first sidewall 213 and the second sidewall 214 of the first housing 210-1. For example, a pair of second stopper members 242 may be provided to be symmetric to each other with respect to the optical axis. However, the number of second stopper members 242 is not limited to the illustrated embodiment. In another example, one second stopper member 242 may be provided and may be disposed on only one of the first sidewall 213 and the second sidewall 214.

In an embodiment, the first stopper member 241 and the second stopper members 242 may be formed in substantially the same shape. For example, each of the first stopper member 241 and the second stopper members 242 may include the base part 243, the linear stopper 244, the buffer stopper 245, and the rotational stopper 249.

Hereinafter, the base part 243, the linear stopper 244, the buffer stopper 245, and the rotational stopper 249 of the first stopper member 241 are referred to as the first base part, stopper 1-1, stopper 2-1, and stopper 3-1, respectively, and the base part 243, the linear stopper 244, the buffer stopper 245, and the rotational stopper 249 of each of the second stopper members 242 are referred to as the second base part, stopper 1-2, stopper 2-2, and stopper 3-2, respectively. This is to distinguish between the components of the first stopper member 241 and the second stopper member 242 and does not mean that the shapes or functions thereof differ from each other.

In an embodiment, the first stopper member 241 may include the first base part 243 fixedly coupled to the first housing 210-1, and stopper 1-1 244, stopper 2-1 245, and stopper 3-1 249 that are coupled to the first base part 243. For example, the first base part 243 may be fit into the first sidewall 213 of the first housing 210-1. The first base part 243 may include the first portion 243a and the second portion 243b extending substantially perpendicular from the first portion 243a toward the bottom surface 212 of the first housing 210-1.

In an embodiment, the first stopper member 241 may be coupled to the first sidewall 213 of the first housing 210-1 such that stopper 1-1 244 faces the lens assembly 220. For example, the first stopper member 241 may be coupled to the first sidewall 213 such that stopper 1-1 244 faces the second optical axis direction ② and stopper 2-1 245 faces the first optical axis direction ①. For example, stopper 1-1 244 may face the lens assembly 220 in the direction of the optical axis L, and stopper 2-1 245 may face the fourth sidewall 216 of the first housing 210-1 in the direction of the optical axis L.

In an embodiment, stopper 1-1 244 may be located in the first optical axis direction ① with respect to the lens assembly 220. For example, stopper 1-1 244 may be located in the first optical axis direction ① from the lens assembly 220 (or the extending portion 225 of the fixing member 223). Accordingly, stopper 1-1 244 may limit a movement range of the lens assembly 220 in the first optical axis direction ①. Stopper 1-1 244 may be brought into contact with the lens assembly 220 when the lens assembly 220 moves in the first optical axis direction ① and may be spaced apart from the lens assembly 220 when the lens assembly 220 moves in the second optical axis direction ②.

In an embodiment, stopper 1-1 244 may include the fixed portion 247 fixed to the second portion 243b of the first base part 243 and the flexible portion 246 extending from the fixed portion 247. The recess 248 (or the elastic recess) may be formed between the fixed portion 247 and the flexible portion 246. The flexible portion 246 may move or elastically deform toward the fixed portion 247 as the lens assembly 220 moves in the first optical axis direction ①. For example, the recess 248 may be narrowed as the lens assembly 220 moves in the first optical axis direction ①.

According to the embodiment illustrated in FIG. 7, when the lens assembly 220 moves in the first optical axis direction ①, the extending portion 225 of the fixing member 223 may make contact with the flexible portion 246 and may push the flexible portion 246 in the first optical axis direction ①. At least part (e.g., the portion illustrated by the dotted line) of the flexible portion 246 may elastically deform while moving a specified distance in the first optical axis direction ①. Accordingly, stopper 1-1 244 may serve as a stopper that restricts the extending portion 225 of the fixing member 223 from further moving in the first optical axis direction ① and at the same time, may absorb or dissipate (e.g., damper) an impact caused by contact (collision) of the extending portion 225 of the fixing member 223 or may reduce noise.

In an embodiment, stopper 2-1 245 may prevent damage caused by collision with the fourth sidewall 216 of the first housing 210-1 when an excessive impact is applied to stopper 1-1 244.

In an embodiment, the second stopper members 242 may include the second base parts 243 fixedly coupled to the first housing 210-1, and stoppers 1-2 244, stoppers 2-2 245, and stoppers 3-2 249 that are coupled to the second base parts 243. For example, the second base parts 243 may be fit into the first sidewall 213 and the second sidewall 214 of the first housing 210-1. The second base parts 243 may include the first portions 243a and the second portions 243b substantially perpendicularly extending from the first portions 243a toward the bottom surface 212 of the first housing 210-1.

In an embodiment, the second stopper members 242 may be coupled to the first sidewall 213 and the second sidewall 214 of the first housing 210-1 such that stoppers 1-2 244 face the lens assembly 220. For example, the second stopper members 242 may be coupled to the first sidewall 213 and the second sidewall 214 such that stoppers 1-2 244 face the first optical axis direction ① and stoppers 2-2 245 face the second optical axis direction ②. For example, stoppers 1-2 244 may face the lens assembly 220 in the direction of the optical axis L, and stoppers 2-2 245 may face the reflective member assembly 230 in the direction of the optical axis L.

In an embodiment, stoppers 1-2 244 may be located in the second optical axis direction ② with respect to the lens assembly 220. For example, stoppers 1-2 244 may be located in the second optical axis direction ② from the lens assembly 220 (or the lens carrier 222). Accordingly, stoppers 1-2 244 may limit a movement range of the lens assembly 220 in the second optical axis direction ②. Stoppers 1-2 244 may be brought into contact with the lens assembly 220 when the lens assembly 220 moves in the second optical axis direction ② and may be spaced apart from the lens assembly 220 when the lens assembly 220 moves in the first optical axis direction ①.

In an embodiment, stoppers 1-2 244 may include the fixed portions 247 fixed to the second portions 243b of the second base parts 243 and the flexible portions 246 extending from the fixed portions 247. The recesses 248 (or the elastic recesses) may be formed between the fixed portions 247 and the flexible portions 246. The flexible portions 246 may move or elastically deform toward the fixed portions 247 as the lens assembly 220 moves in the second optical axis direction ②. For example, the recesses 248 may be narrowed as the lens assembly 220 moves in the second optical axis direction ②.

According to the embodiment illustrated in FIG. 7, when the lens assembly 220 moves in the second optical axis direction ②, the lens carrier 222 may make contact with the flexible portions 246 and may push the flexible portions 246 in the second optical axis direction ②. At least parts (e.g., the portions illustrated by the dotted lines) of the flexible portions 246 may elastically deform while moving a specified distance in the second optical axis direction ②. Accordingly, stoppers 1-2 244 may serve as stoppers that restrict the lens carrier 222 from further moving in the second optical axis direction ② and at the same time, may absorb or dissipate (e.g., damper) an impact caused by contact (collision) of the lens carrier 222 or may reduce noise.

In an embodiment, stoppers 2-2 245 may be configured such that at least parts thereof make contact with the reflective member assembly 230 when the reflective member assembly 230 performs a rotary motion for an optical image stabilizer (OIS) function. Accordingly, stoppers 2-2 245 may limit a rotational range of the reflective member assembly 230, or may prevent damage to the reflective member assembly 230. The relationship between stoppers 2-2 245 of the second stopper members 242 and the reflective member assembly 230 will be described below with reference to FIGS. 11A and 11B.

In an embodiment, the rotational stopper 249 (hereinafter, stopper 3-1) of the first stopper member 241 and the rotational stoppers 249 (hereinafter, stoppers 3-2) of the second stopper members 242 may limit and/or prevent rotation of the lens assembly 220. For example, stopper 3-1 249 and stoppers 3-2 249 may make contact with the lens carrier 222 to prevent rotation of the lens assembly 220 about the optical axis L inside the first housing 210-1.

In an embodiment, stopper 3-1 249 and stoppers 3-2 249 may be spaced apart from the lens assembly 220 by a predetermined gap, and when the lens assembly 220 rotates about the optical axis L by an external impact or shake, at least parts of stopper 3-1 249 and stoppers 3-2 249 may make contact with the lens assembly 220 to prevent excessive rotation of the lens assembly 220. For example, stopper 3-1 249 and stoppers 3-2 249 may be spaced apart from the lens assembly 220 by a minute gap to substantially limit rotation of the lens assembly 220. When the lens assembly 220 rotates about the optical axis L in the clockwise direction with respect to the drawings, the lens assembly 220 may make contact with stopper 3-2 249 of the second stopper member 242 disposed on the second sidewall 214. Furthermore, when the lens assembly 220 rotates about the optical axis L in the counterclockwise direction, the lens assembly 220 may make contact with stopper 3-1 249 of the first stopper member 241 and stopper 3-2 249 of the second stopper member 242 disposed on the first sidewall 213.

As illustrated in FIG. 8, stopper 3-1 249 and stoppers 3-2 249 may be disposed to overlap the lens assembly 220 when the camera module 220 is viewed from above (e.g., in the −z-axis direction). For example, stopper 3-1 249 may overlap the extending portion 225 of the fixing member 223, and stoppers 3-2 249 may overlap the lens carrier 222. In various embodiments, stopper 3-1 249 and stoppers 3-2 249 may be configured to overlap the lens assembly 220 in the state in which the lens assembly 220 moves in the first optical axis direction ① to the maximum or in the state in which the lens assembly 220 moves in the second optical axis direction ② to the maximum. Accordingly, rotation of the lens assembly 220 may be prevented even in the state in which the lens assembly 220 moves in the first optical axis direction ① or the second optical axis direction ②.

Referring to FIG. 8, the camera module 200 according to an embodiment may include the first reflective member 231 and the second reflective member 291 and may be configured such that the travel path of external light is changed at least once. For example, external light may be incident on the first reflective member 231 in a first direction (e.g., the z-axis direction) perpendicular to the direction of the optical axis L (e.g., the x-axis direction), may be reflected or refracted by the first reflective member 231, and may be incident on the lens unit 221 in the direction of the optical axis L. The light passing through the lens unit 221 may be reflected or refracted by the second reflective member 291 and may be incident on the image sensor 281 in a second direction (e.g., the y-axis direction) perpendicular to the direction of the optical axis L and the first direction. However, the structure and configuration of the camera module 200 is not limited to the illustrated embodiment, and the camera module 200 may not include the second reflective member 291. When the second reflective member 291 is not included, the image sensor 281 may be partially aligned with the lens unit 221 in the direction of the optical axis L.

Referring to FIGS. 7 and 8, the camera module 200 according to an embodiment may limit a movement range of the lens assembly 220 in the direction of the optical axis L through the first stopper member 241 and the second stopper members 242 and may alleviate an impact and noise caused by a movement of the lens assembly 220. For example, the linear stoppers 244 of the first stopper member 241 and the second stopper members 242 may be configured to simultaneously perform functions of a damper and a stopper. According to an embodiment, when the lens assembly 220 moves in the direction of the optical axis L by a shake of the camera module 200 in the state in which power is not supplied to the camera module 200, an excessive movement of the lens assembly 220 may be limited, and noise and vibration caused by collision with other component(s) may be improved.

Figure 9:
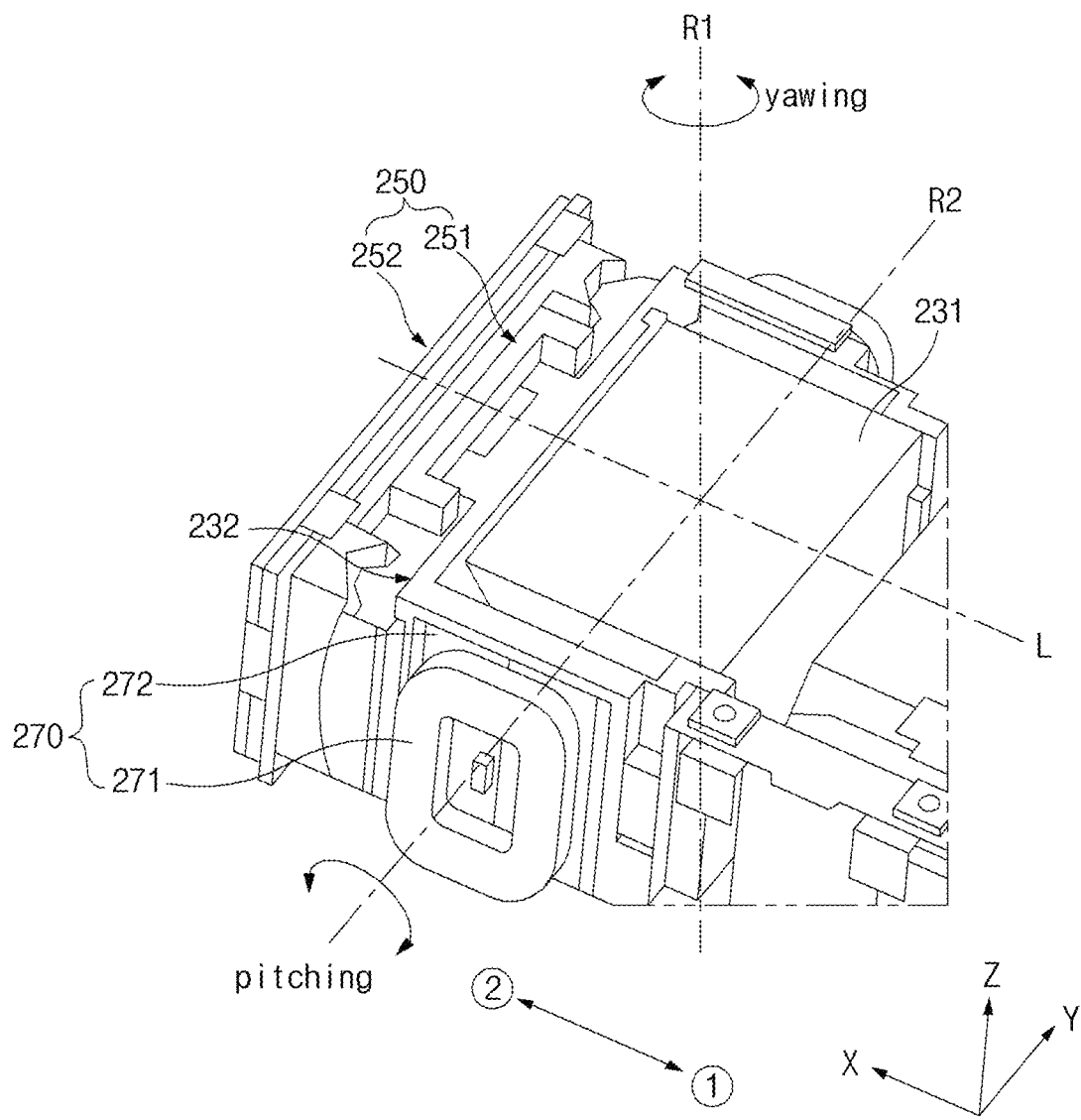
FIG. 9 is a view illustrating a rotary motion of a reflective member assembly of the camera module according to an embodiment.
Figure 10:
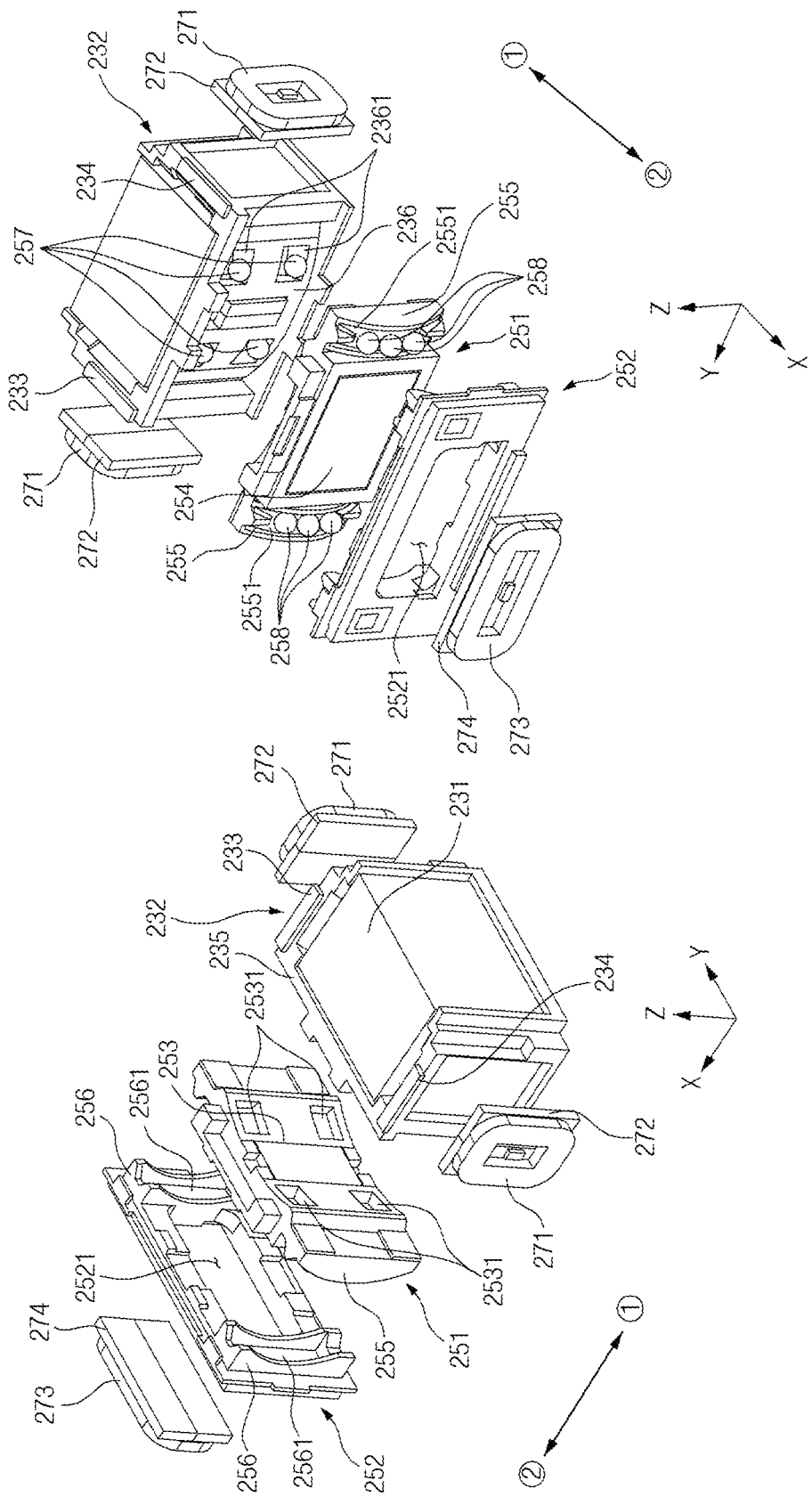
FIG. 10 is a view illustrating the reflective member assembly, a guide structure, and a second drive member of the camera module according to an embodiment.

FIG. 9 is a view illustrating a rotary motion of the reflective member assembly 230 of the camera module 200 according to an embodiment. FIG. 10 is a view illustrating the reflective member assembly 230, the guide structure 250, and the second drive member 270 of the camera module 200 according to an embodiment.

Referring to FIGS. 9 and 10, the camera module 200 according to an embodiment may be configured to provide an optical image stabilizer (OIS) function by rotating the reflective member assembly 230 about the first axis of rotation R1 or the second axis of rotation R2 in a predetermined range.

The camera module 200 according to an embodiment may include the reflective member assembly 230, the guide structure 250, and the second drive member 270. The guide structure 250 may form the axes of rotation R1 and R2 for rotation of the reflective member assembly 230. The second drive member 270 may provide a driving force (e.g., an electro-magnetic force) for rotation of the reflective member assembly 230.

In an embodiment, the reflective member assembly 230 may be configured to rotate about the first axis of rotation R1 perpendicular to the optical axis L (e.g., the x-axis) in a specified range. For example, the first axis of rotation R1 may be parallel to the z-axis. In an embodiment, the reflective member assembly 230 may be configured to rotate about the second axis of rotation R2 perpendicular to the optical axis L and the first axis of rotation R1 in a specified range. For example, the second axis of rotation R2 may be parallel to the y-axis. For example, a rotary motion of the reflective member assembly 230 about the first axis of rotation R1 may be understood as a yaw tilt motion or a yawing motion. For example, a rotary motion of the reflective member assembly 230 about the second axis of rotation R2 may be understood as a pitch tilt motion or a pitching motion.

In an embodiment, the reflective member assembly 230 may include the first reflective member 231 and the holder 232 in which at least part of the first reflective member 231 is accommodated. For example, the first reflective member 231 may be coupled to the holder 232 so as to rotate and/or move together with the holder 232. In an embodiment, at least a part (e.g., the second magnets 272) of the second drive member 270 may be disposed on the holder 232. The first guide member 251 may be coupled to the holder 232 so as to be rotatable about the first axis of rotation R1.

In an embodiment, the holder 232 may include border parts 233, 234, and 235 surrounding at least part of the first reflective member 231. For example, the border parts of the holder 232 may include the first border part 233 and the second border part 234 that extend parallel to the direction of the optical axis L and face each other, and the third border part 235 that connects the first border part 233 and the second border part 234 and that is perpendicular to the direction of the optical axis L. For example, the first border part 233 and the second border part 234 may refer to the sidewalls facing the direction (e.g., the y-axis direction) perpendicular to the optical axis L, and the third border part 235 may refer to the sidewall facing the second optical axis direction (e.g., the x-axis direction). Referring to FIG. 5 together, the first border part 233 of the holder 232 may face the +y-axis direction to face the first sidewall 213 (e.g., the second opening area 2132) of the first housing (e.g., the first housing 210-1 of FIG. 5), the second border part 234 may face the −y-axis direction to face the second sidewall 214 (e.g., the fourth opening area 2142) of the first housing 210-1, and the third border part 235 may face the +x-axis direction to face the third sidewall 215 (e.g., the fifth opening area 2151).

In an embodiment, the second magnets 272 may be disposed on the first border part 233 and the second border part 234 of the holder 232. The first guide member 251 may be coupled to the third border part 235 of the holder 232 so as to be rotatable. In an embodiment, the holder 232 may be configured to rotate about the first axis of rotation R1 relative to the first guide member 251. The holder 232 may be configured to rotate about the second axis of rotation R2 relative to the second guide member 252 together with the first guide member 251.

In an embodiment, the guide structure 250 may include the first guide member 251 coupled to the holder 232 so as to be rotatable about the first axis of rotation R1 and the second guide member 252 coupled to the first guide member 251 so as to be rotatable about the second axis of rotation R2.

In an embodiment, the first guide member 251 may be located between the holder 232 and the second guide member 252. The first guide member 251 may include a first surface 253 facing the holder 232 and a second surface 254 facing the second guide member 252. For example, the first surface 253 may refer to the surface facing the first optical axis direction ①, and the second surface 254 may refer to the surface facing the second optical axis direction ②. In an embodiment, the third magnet 274 may be disposed on the second surface 254 of the first guide member 251.

In an embodiment, the first guide member 251 may be coupled to the third border part 235 of the holder 232. The first guide member 251 may be configured to rotate about the first axis of rotation R1 relative to the holder 232 in a predetermined range.

In an embodiment, the first axis of rotation R1 may be formed by the first surface 253 of the first guide member 251 and the third border part 235 of the holder 232. For example, the first surface 253 of the first guide member 251 may be formed to be a curved surface having a substantially arc shape, and a curved area 236 corresponding to the shape of the first surface 253 may be formed on the third border part 235 facing the first guide member 251. In an embodiment, the center of the arc of the first surface 253 may be defined as the first axis of rotation R1. For example, the first surface 253 may be formed to be a curved surface having a predetermined curvature, and the first axis of rotation R1 may be understood as a virtual axis passing through the center of curvature of the curved surface in the z-axis direction.

In an embodiment, a plurality of second balls 257 for guiding rotation of the holder 232 may be disposed between the first surface 253 of the first guide member 251 and the third border part 235. For example, the first guide member 251 may have, on the first surface 253 thereof, second recesses 2531 in which at least parts of the plurality of second balls 257 are accommodated so as to be rotatable. The third border part 235 may have, on the curved area 236 thereof, third recesses 2361 overlapping the second recesses 2531 in the direction of the optical axis L (e.g., the x-axis direction). For example, as many second recesses 2531 and third recesses 2361 as the plurality of second balls 257 may be formed. In an embodiment, the plurality of second balls 257 may be configured to roll in the spaces between the second recesses 2531 and the third recesses 2361. The plurality of second balls 257 may rotate at specified positions in the spaces, or may rotate while linearly moving.

In an embodiment, the first guide member 251 may be coupled with the second guide member 252. The first guide member 251 may be configured to rotate about the second axis of rotation R2 relative to the second guide member 252. For example, the first guide member 251, when rotating about the second axis of rotation R2, may rotate together with the holder 232.

In an embodiment, the second guide member 252 may be disposed to face the second surface 254 of the first guide member 251. The second guide member 252 may be coupled to the first guide member 251 so as to be rotatable about the second axis of rotation R2 in a predetermined range. FIG. 9 is a view in which the first housing (e.g., the first housing 210-1 of FIG. 5) is omitted. However, the second guide member 252 may be coupled to the third sidewall (e.g., the third sidewall 215 of FIG. 5) of the first housing 210-1. For example, the second guide member 252 may be fixedly disposed on the third sidewall 215 of the first housing 210-1, and the first guide member 251 and the reflective member assembly 230 may rotate together relative to the second guide member 252.

In an embodiment, the second axis of rotation R2 may be formed by the second surface 254 of the first guide member 251 and the second guide member 252. For example, the second guide member 252 may include protruding portions 256 protruding toward the second surface 254 of the first guide member 251, and fourth recesses 2561 having an arc shape may be formed on the protruding portions 256. Fifth recesses 2551 having an arc shape corresponding to the fourth recesses 2561 may be formed on edge portions 255 of the first guide member 251 facing the second guide member 252. In an embodiment, the center of the arcs of the fourth recesses 2561 or the fifth recesses 2551 may be defined as the second axis of rotation R2. For example, the fourth recesses 2561 or the fifth recesses 2551 may be formed of curves having a predetermined curvature, and the second axis of rotation R2 may be understood as a virtual axis passing through the center of curvature of the curves in the y-axis direction.

In an embodiment, a plurality of third balls 258 for guiding rotation of the first guide member 251 may be disposed between the protruding portions 256 of the second guide member 252 and the edge portions 255 of the first guide member 251. For example, the plurality of third balls 258 may be accommodated in the fourth recesses 2561 and the fifth recesses 2551 so as to be rotatable. For example, the fourth recesses 2561 of the second guide member 252 and the fifth recesses 2551 of the first guide member 251 may be formed to overlap each other in the direction of the optical axis L (e.g., the x-axis direction). For example, as many second recesses 2531 and third recesses 2361 as the plurality of third balls 258 may be formed. In an embodiment, the plurality of third balls 258 may be configured to roll in the spaces between the fourth recesses 2561 and the fifth recesses 2551. The plurality of third balls 258 may rotate at specified positions in the spaces, or may rotate while linearly moving.

In an embodiment, an opening portion 2521 may be formed in the central area of the second guide member 252. For example, the opening portion 2521, when viewed in the direction of the optical axis L, may overlap part of the second surface 254 of the first guide member 251. The third coil 273 may face the third magnet 274, which is disposed on the second surface 254 of the first guide member 251, through the opening portion 2521. For example, the opening portion 2521, when viewed in the direction of the optical axis L, may overlap the fifth opening area (e.g., the fifth opening area 2151 of FIG. 5) of the first housing (e.g., the first housing 210-1 of FIG. 5) such that the third coil 273 interacts with the third magnet 274.

In an embodiment, the second drive member 270 may include the second coils 271 and the second magnets 272 configured to rotate the reflective member assembly 230 about the first axis of rotation R1, and the third coil 273 and the third magnet 274 configured to rotate the reflective member assembly 230 about the second axis of rotation R2. For example, the second coils 271 and the second magnets 272 may electro-magnetically interact with each other. For example, the third coil 273 and the third magnet 274 may electro-magnetically interact with each other.

In an embodiment, the second magnets 272 may be disposed on the first border part 233 and the second border part 234 of the holder 232. The second coils 271 may be disposed on the first sidewall 213 and the second sidewall 214 of the first housing (e.g., the first housing 210-1 of FIG. 5) to face the second magnets 272. Although the first housing 210-1 is not illustrated in FIG. 9, the second coils 271 may be located in the second opening area 2132 of the first sidewall 213 and the fourth opening area 2142 of the second sidewall 214. In an embodiment, the camera module 200 may rotate the reflective member assembly 230 about the first axis of rotation R1 by controlling an electric current flowing through the second coils 271. For example, the second coils 271 may be located in a magnetic field formed by the second magnets 272. In an embodiment, the processor (e.g., the processor 520 of FIG. 19 and/or an image signal processor 660 of FIG. 20) may control the direction and/or strength of the electric current passing through the second coils 271. An electro-magnetic force (e.g., Lorentz force) may be applied to the second magnets 272 to correspond to the direction of the electric current passing through the second coils 271. The reflective member assembly 230 may rotate about the first axis of rotation R1 by the electro-magnetic force.

In an embodiment, the third magnet 274 may be disposed on the second surface 254 of the first guide member 251. The third coil 273 may be disposed on the third sidewall 215 of the first housing (e.g., the first housing 210-1 of FIG. 5) to face the third magnet 274. Although the first housing 210-1 is not illustrated in FIG. 9, the third coil 273 may be located in the fifth opening area 2151 of the third sidewall 215. In an embodiment, the camera module 200 may rotate the first guide member 251 and the reflective member assembly 230 about the second axis of rotation R2 by controlling an electric current flowing through the third coil 273. For example, the third coil 273 may be located in a magnetic field formed by the third magnet 274. In an embodiment, the processor (e.g., the processor 520 of FIG. 19 and/or an image signal processor 660 of FIG. 20) may control the direction and/or strength of the electric current passing through the third coil 273. An electro-magnetic force (e.g., Lorentz force) may be applied to the third magnet 274 to correspond to the direction of the electric current passing through the third coil 273. The first guide member 251 and the reflective member assembly 230 may rotate about the second axis of rotation R2 by the electro-magnetic force.

Figure 11A:
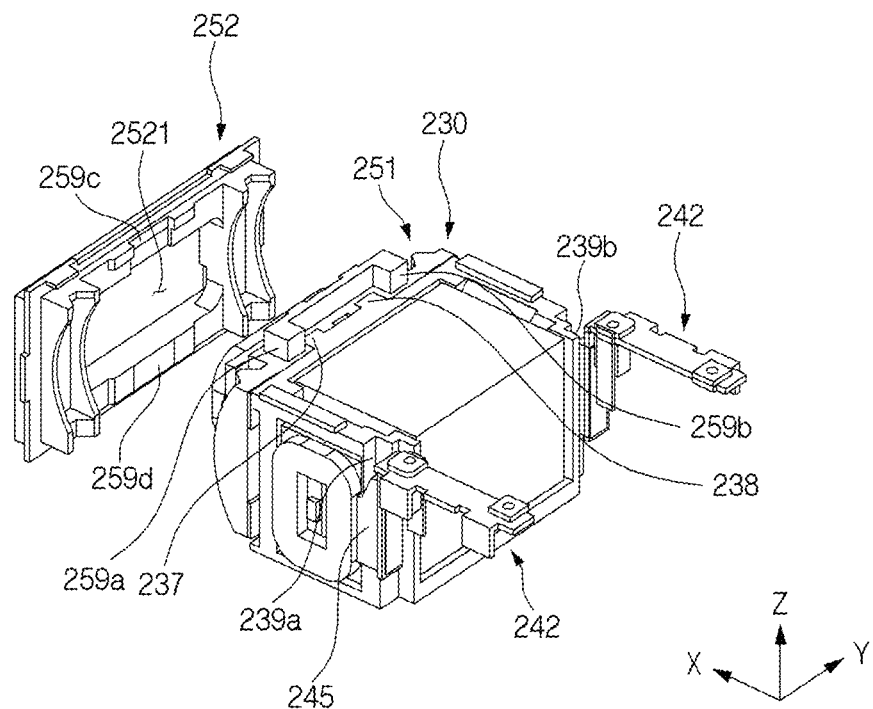
FIG. 11A is a view illustrating the reflective member assembly, the guide structure, and second stopper members of the camera module according to an embodiment.
Figure 11B:
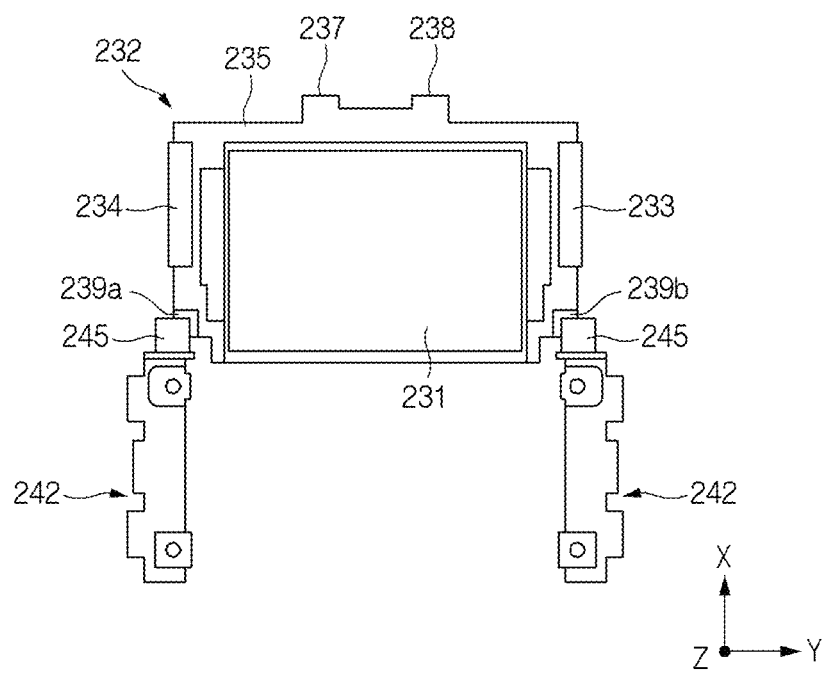
FIG. 11B is a view illustrating the reflective member assembly and the second stopper members of the camera module according to an embodiment.

FIG. 11A is a view illustrating the reflective member assembly 230, the guide structure 250, and the second stopper members 242 of the camera module 200 according to an embodiment. FIG. 11B is a view illustrating the reflective member assembly 230 and the second stopper members 242 of the camera module 200 according to an embodiment.

Referring to FIGS. 11A and 11B, the camera module 200 according to an embodiment may include a stopper structure that limits a rotational range of the reflective member assembly 230. For example, the stopper structure may guide a rotary motion of the reflective member assembly 230 within a specified angle range, and when the reflective member assembly 230 rotates through more than the specified angle, the rotation of the reflective member assembly 230 may be limited by contact of the stopper structure.

The camera module 200 according to an embodiment may include the reflective member assembly 230, the first guide member 251, the second guide member 252, and the second stopper members 242. The stopper structure may include a structure formed on the reflective member assembly 230 and the first guide member 251 and a structure formed on the second guide member 252.

In an embodiment, protrusions 237 and 238 protruding toward the first guide member 251 may be formed on the third border part 235 of the holder 232. For example, the protrusions 237 and 238 may include the first protrusion 237 and the second protrusion 238 spaced apart from the first protrusion 237. The first protrusion 237 and the second protrusion 238 may limit a rotational range of the reflective member assembly 230 by making contact with extensions 259a and 259b of the first guide member 251 when the reflective member assembly 230 (or the holder 232) rotates about a first axis of rotation (e.g., the first axis of rotation R1 of FIG. 9) relative to the first guide member 251. According to various embodiments, the first protrusion 237 and the second protrusion 238 may be formed to be one portion without being distinguished from each other.

In an embodiment, the first guide member 251 may have, at an upper edge (e.g., the edge facing the +z-axis direction), the extensions 259a and 259b extending to surround at least parts of the protrusions 237 and 238. For example, the extensions 259a and 259b may include the first extension 259a located adjacent to the first protrusion 237 and the second extension 259b located adjacent to the second protrusion 238. For example, the first protrusion 237 and the second protrusion 238 may be located inward of the extensions 259a and 259b. For example, when the reflective member assembly 230 and the first guide member 251 are viewed from above (in the −z-axis direction), the first protrusion 237 and the second protrusion 238 may be disposed to be accommodated in the space formed by the extensions 259a and 259b. When the reflective member assembly 230 (or the holder 232) rotates about the first axis of rotation (e.g., the first axis of rotation R1 of FIG. 9) relative to the first guide member 251, inner sidewalls of the extensions 259a and 259b may make contact with the protrusions 237 and 238 and may limit a rotational range of the reflective member assembly 230. For example, when the reflective member assembly 230 rotates about the first axis of rotation R1 in the clockwise direction by a predetermined angle with respect to FIGS. 11A and 11B, the second protrusion 238 may make contact with the second extension 259b, and when the reflective member assembly 230 rotates about the first axis of rotation R1 in the counterclockwise direction by a predetermined angle, the first protrusion 237 may make contact with the first extension 259a.

In an embodiment, bumpers 259c and 259d may be formed at upper and lower edges of the second guide member 252. For example, the bumpers 259c and 259d may include the first bumper 259c located over the opening 2521 of the second guide member 252 (e.g., in the +z-axis direction) and the second bumper 259d located under the opening 2521 (e.g., in the −z-axis direction). The bumpers 259c and 259d may limit a rotational range of the first guide member 251 by making contact with part of the first guide member 251 when the first guide member 251 rotates about a second axis of rotation (e.g., the second axis of rotation R2 of FIG. 9). In various embodiments, the bumpers 259c and 259d may be formed of an elastic material or a flexible material to absorb an impact caused by contact of the first guide member 251.

In an embodiment, the second stopper members 242 may be configured to limit a rotational range of the reflective member assembly 230 together with the stopper (e.g., a primary stopper). For example, at least parts of the second stopper members 242 may perform a function of a secondary stopper against a rotary motion of the reflective member assembly 230.

In an embodiment, the second stopper members 242 may be configured such that the buffer stoppers 245 are located adjacent to border parts (e.g., the first border part 233 and the second border part 234) of the holder 232. For example, the holder 232 may have, on the border parts 233 and 234 thereof, step portions 239a and 239b on which at least parts of the buffer stoppers 245 are disposed. For example, the step portions 239a and 239b may include the first step portion 239b formed on the first border part 233 and the second step portion 239a formed on the second border part 234. For example, at least parts of the border parts 233 and 234 may be recessed to form the step portions 239a and 239b, and the step portions 239a and 239b may extend in the z-axis direction. In an embodiment, at least parts of the buffer stoppers 245 of the second stopper members 242 may be disposed on the step portions 239a and 239b. For example, as illustrated in FIG. 11B, the buffer stoppers 245 may overlap the first step portion 239b and the second step portion 239a when the reflective member assembly 230 is viewed from above (e.g., in the −z-axis direction).

In an embodiment, when the reflective member assembly 230 rotates through more than a specified angle, the second stopper members 242 may make contact with the holder 232 and may limit the rotation of the reflective member assembly 230. For example, the buffer stoppers 245 may be configured to make contact with the inside surface of the first step portion 239b or the second step portion 239a in response to rotation of the holder 232. In an embodiment, when an excessive movement of the reflective member assembly 230 is caused by an external impact, the second stopper members 242 may make contact with the holder 232 and may absorb the impact and prevent damage. For example, the buffer stoppers 245 may be formed of an elastic material or a flexible material and thus may be configured to prevent damage when colliding with the holder 232.

Figure 12:
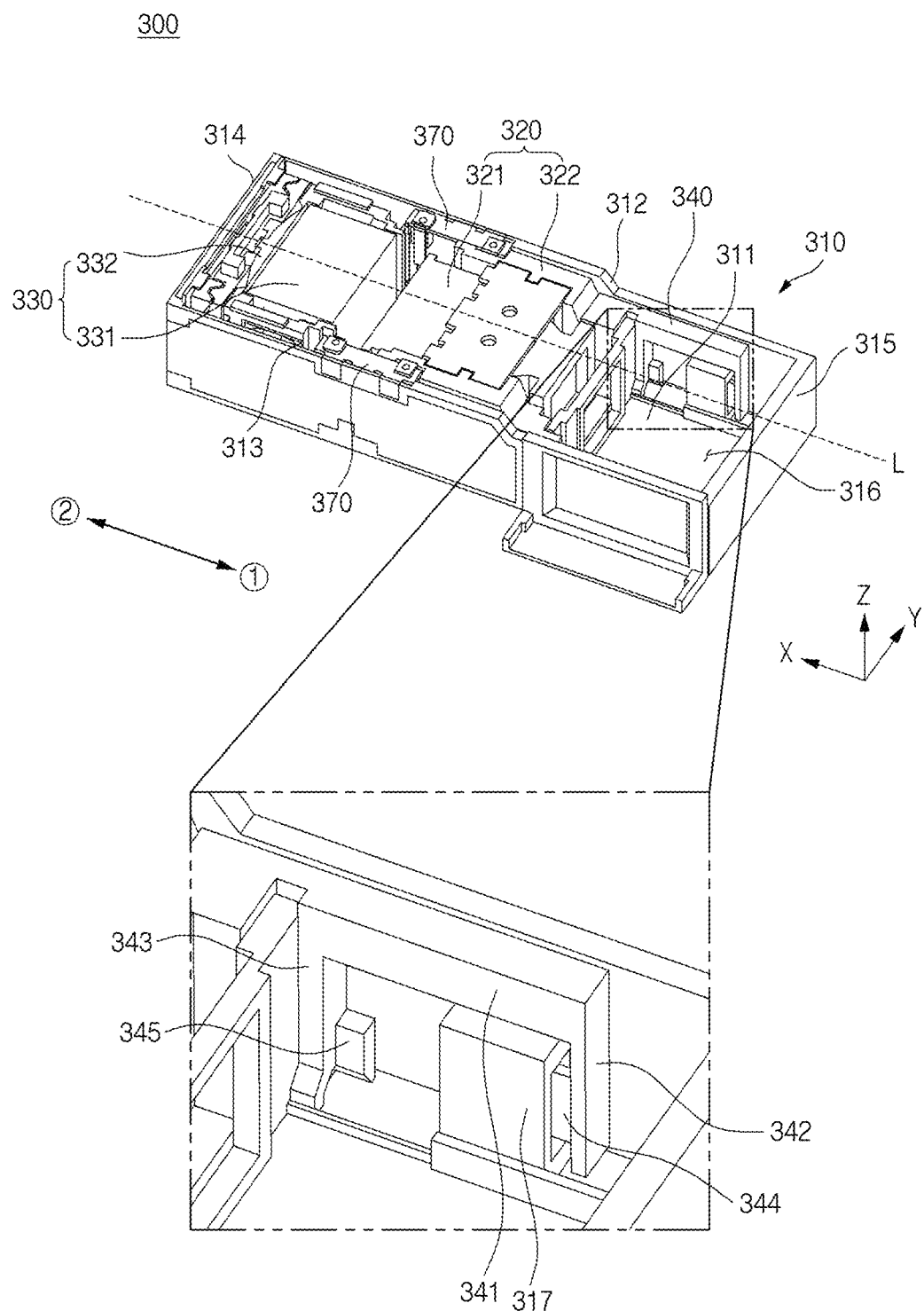
FIG. 12 is a view illustrating a camera module according to an embodiment.
Figure 13A:
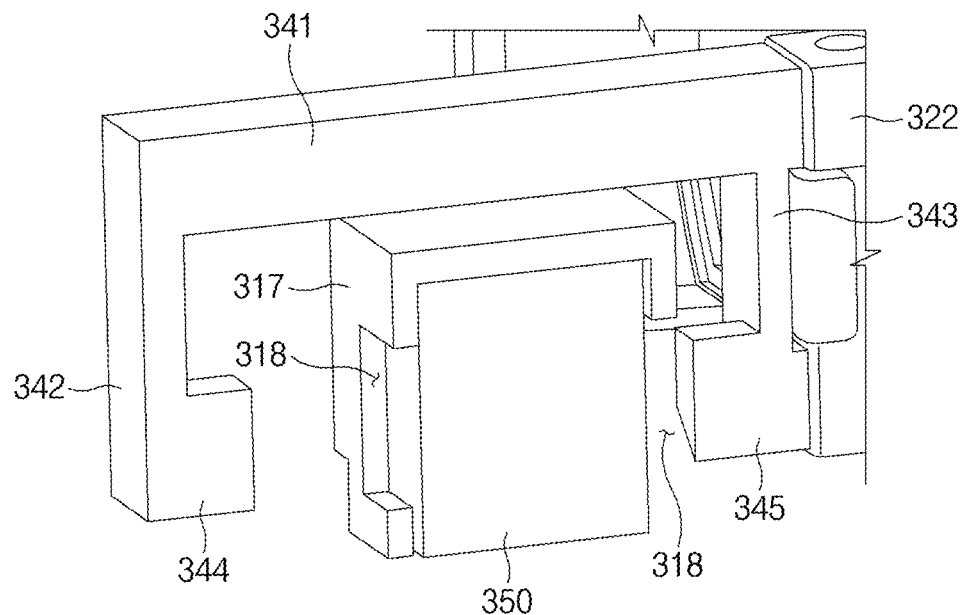
FIG. 13A is a view illustrating a support member and a damping member of the camera module according to an embodiment.
Figure 13B:
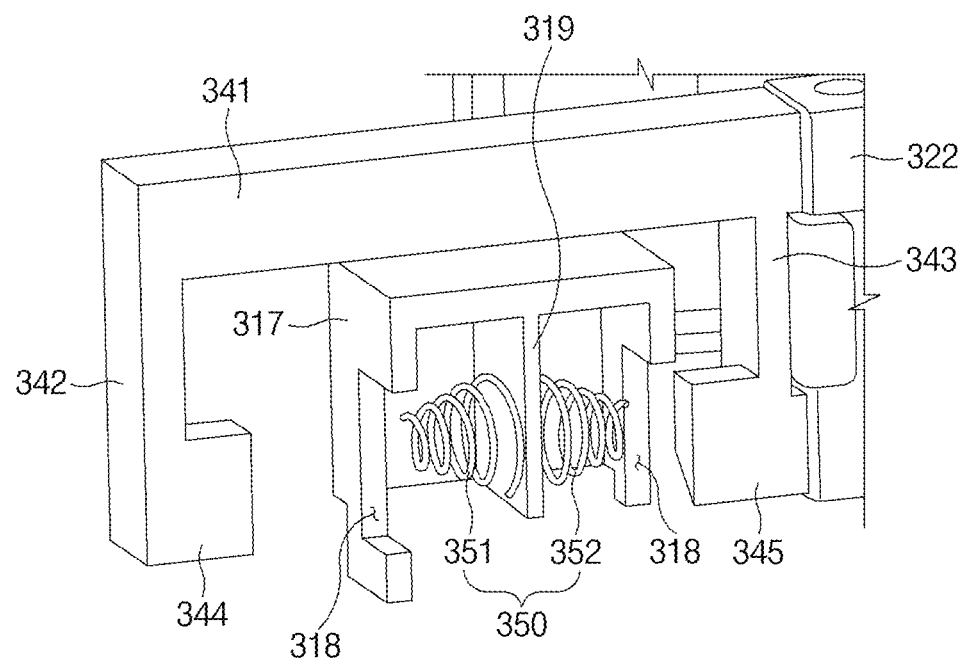
FIG. 13B is a view illustrating the support member and the damping member of the camera module according to an embodiment.
Figure 14:
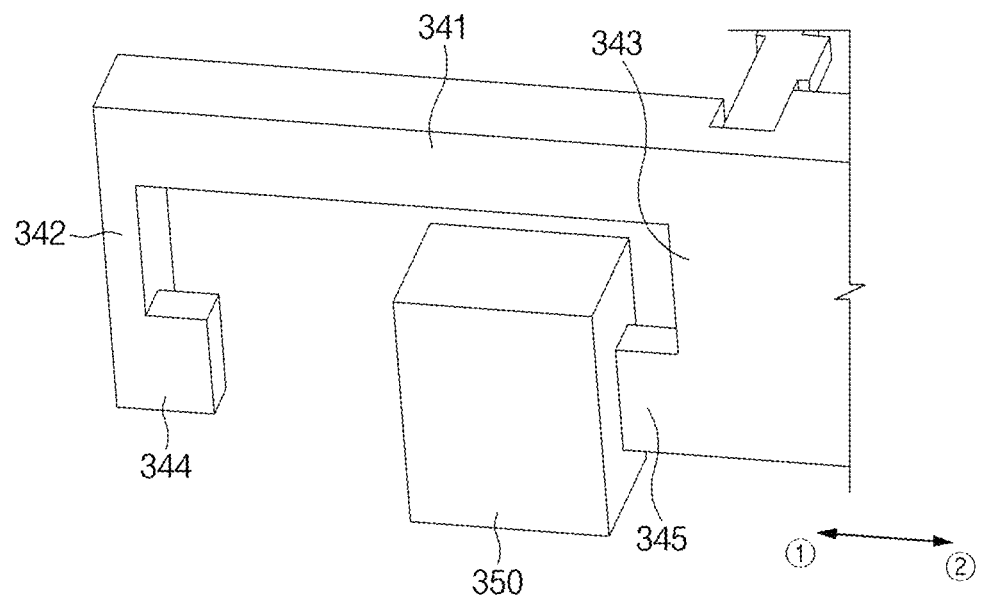
FIG. 14 is a view illustrating operations of the support member and the damping member of the camera module according to an embodiment.
Figure 14:
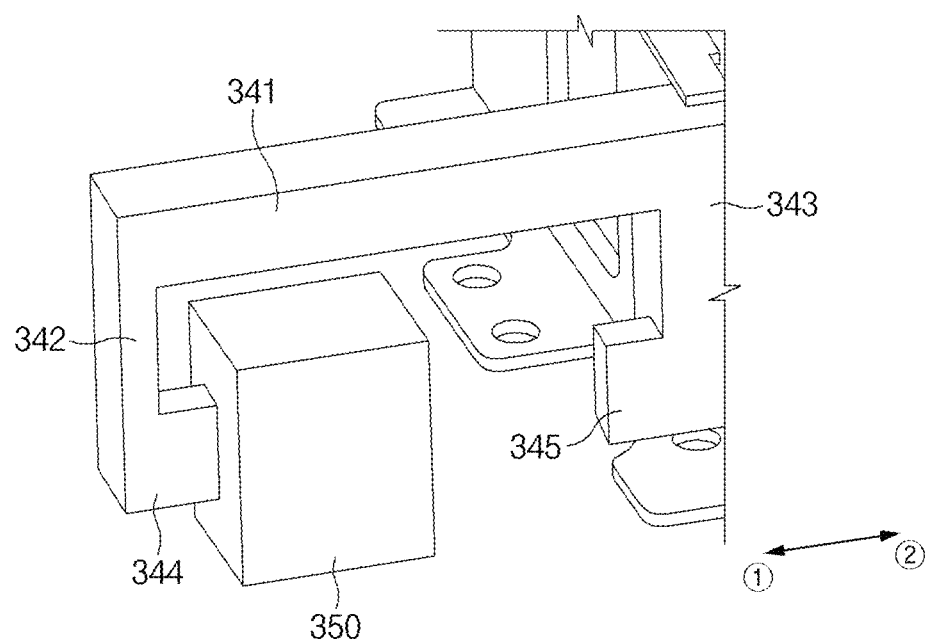

FIG. 12 is a view illustrating a partial configuration of a camera module 300 according to an embodiment. FIG. 13A is a view illustrating a support member 340 and a damping member 350 of the camera module 300 according to an embodiment. FIG. 13B is a view illustrating the support member 340 and the damping member 350 of the camera module 300 according to an embodiment. FIG. 14 is a view illustrating operations of the support member 340 and the damping member 350 of the camera module 300 according to an embodiment.

Referring to FIGS. 12, 13A, and 13B, the camera module 300 according to an embodiment may include a camera housing 310 (e.g., the camera housing 210 of FIGS. 4 and 5), a lens assembly 320 (e.g., the lens assembly 220 of FIGS. 4 and 5), a reflective member assembly 330 (e.g., the reflective member assembly 230 of FIGS. 4 and 5), stopper members 370 (e.g., the stopper member 240 of FIGS. 4 and 5), the support member 340, and the damping member 350.

FIGS. 12, 13A, and 13B illustrate the camera module 300 according to another embodiment that does not include the first stopper member (e.g., the first stopper member 241 of FIGS. 7 and 8) in the camera module 200 illustrated in FIGS. 4 to 8 and includes the support member 340 and the damping member 350.

Some of the components of the camera module 300 illustrated in FIGS. 12, 13A, and 13B are identical or similar to the components of the camera module 200 illustrated in FIGS. 4 to 8, and therefore repetitive descriptions will hereinafter be omitted. The camera housing 310 illustrated in FIG. 12 may be referred to as the first housing 310 (e.g., the first housing 210-1 of FIGS. 4 and 5), and FIG. 12 may be a view in which a second housing (e.g., the second housing 210-2 of FIGS. 4 and 5) is omitted. The stopper members 370 illustrated in FIG. 12 may be referred to as the second stopper members (e.g., the second stopper members 242 of FIGS. 7 and 8). For example, the positions, shapes, and/or functions of the second stopper members 370 illustrated in FIG. 12 may be identical to the contents described above with reference to FIGS. 6A to 11B.

In an embodiment, the camera housing 310 includes a first sidewall 312, a second sidewall 313 parallel to the first sidewall 312, a third sidewall 314 connecting one end of the first sidewall 312 and the second sidewall 313, and a fourth sidewall 315 connecting the other ends of the first sidewall 312 and the second sidewall 313 and parallel to the third sidewall 314. In an embodiment, the lens assembly 320 may include a lens unit 321 and a lens carrier 322 on which the lens unit 321 is disposed. In an embodiment, the reflective member assembly 330 may include a first reflective member 331 and a holder 332 supporting the first reflective member 331.

In an embodiment, the support member 340 may at least partially make contact with the damping member 350 and may limit a movement range of the lens assembly 320 in the direction of an optical axis L. The support member 340 may be configured to move together with the lens assembly 320 in the direction of the optical axis L. For example, the support member 340 may extend from part of a lens carrier 322 in a first optical axis direction ①. In various embodiments, the support member 340 may be integrally formed with the lens carrier 322, or may be configured to be coupled to the lens carrier 322.

In an embodiment, the support member 340 may extend toward a second reflective member receiving section 316 where a second reflective member (e.g., the second reflective member 291 of FIGS. 5, 7, and 8) is disposed in a receiving space of the first housing 310. For example, the first housing 310 may include the second reflective member receiving section 316 formed between a fourth sidewall 315 and the lens assembly 320, and the support member 340 and the damping member 350 may be located in the second reflective member receiving section 316. The second reflective member receiving section 316 may face the space in which the reflective member assembly 330 is disposed, with the lens assembly 320 therebetween. Although the second housing (e.g., the second housing 210-2 of FIGS. 4 and 5) is not illustrated in FIG. 12, the second reflective member receiving section 316 may be located to be spaced apart from a light receiving area (e.g., the light receiving area 211 of FIGS. 4 and 5) in the second housing 210-2 in the first optical axis direction ①. Accordingly, radiation of noise caused by contact of the support member 340 and the damping member 350 to the outside of the camera housing 310 through the light receiving area 211 may be reduced.

In an embodiment, the support member 340 may include a first portion 341 extending parallel to the optical axis L, a second portion 342 perpendicularly extending from an end portion of the first portion 341 that faces the first optical axis direction ①, and a third portion 343 perpendicularly extending from an end portion of the first portion 3412 that faces a second optical axis direction ②. The second portion 342 and the third portion 343 may be extending in a vertical direction (e.g., z-axis direction) in relation to the electronic device 100 with a front surface facing the vertical direction. For example, the second portion 342 and the third portion 343 may extend from the first portion 341 toward a base 311 of the first housing 310. In an embodiment, a first protruding portion 344 may be formed on the second portion 342, and a second protruding portion 345 facing the first protruding portion 344 may be formed on the third portion 343. For example, the first protruding portion 344 may protrude from a partial area of the second portion 342 in the second optical axis direction ②. The second protruding portion 345 may protrude from a partial area of the third portion 343 in the first optical axis direction ①. The first protruding portion 344 may be configured to make contact with the damping member 350 when the lens assembly 320 moves a predetermined distance in the second optical axis direction ②. The second protruding portion 345 may be configured to make contact with the damping member 350 when the lens assembly 320 moves a predetermined distance in the first optical axis direction ①.

In an embodiment, the damping member 350 may be configured to make contact with the first protruding portion 344 or the second protruding portion 345 of the support member 340 in response to a movement of the lens assembly 320. The damping member 350 may be formed of a material capable of absorbing an impact when the first protruding portion 344 or the second protruding portion 345 makes contact with the damping member 350. For example, the damping member 350 may contain an elastic material or a flexible material. For example, the damping member 350 may include a spring, sponge, Poron, rubber, or urethane.

In an embodiment, the damping member 350 may be disposed on a first sidewall 312 of the first housing 310. For example, the first housing 310 may have, on the first sidewall 312 thereof, a damping member receiving part 317 in which the damping member 350 is accommodated. The damping member receiving part 317 may be formed in a hollow form such that the damping member 350 is accommodated inside and may include, in opposite side surfaces thereof, openings 318 through which the first protruding portion 344 and the second protruding portion 345 makes contact with the damping member 350.

Referring to FIG. 13A, the damping member 350 may include sponge, Poron, rubber, or urethane that has a predetermined shape. For example, the damping member 350 may be formed in a shape corresponding to the damping member receiving part 317. At least parts of the damping member 350 may be exposed through the openings 318 of the damping member receiving part 317. The first protruding portion 344 and the second protruding portion 345 may make contact with the damping member 350 through the openings 318.

Referring to FIG. 13B, the damping member 350 may include springs 351 and 352. For example, the damping member 350 may be configured such that one end portion thereof is supported by a support wall 319 of the damping member receiving part 317. For example, the damping member 350 may include the first spring and the second spring, each of which has one end portion supported by the support wall 319. The first spring 351 may be disposed such that the one end portion is supported by the support wall 319 and the opposite end portion faces toward a corresponding one of the openings 318. The second spring 352 may be disposed such that the one end portion is supported by the support wall 319 and the opposite end portion faces toward the other opening 318. The first protruding portion 344 may make contact with the first spring 351 through the corresponding opening 318. The second protruding portion 345 may make contact with the second spring 352 through the other opening 318.

Hereinafter, operations of the support member 340 and the damping member 350 will be described with reference to FIG. 14.

The damping member 350 illustrated in FIG. 14 may be referred to as the damping member illustrated in FIG. 13A. However, the damping member 350 may include springs as illustrated in FIG. 13B.

Referring to FIG. 14, as at least part of the support member 340 makes contact with the damping member 350, the camera module 300 according to an embodiment may absorb an impact and/or noise caused by a movement of the lens assembly 320 at the same time as limiting a movement range of the lens assembly 320 in the direction of the optical axis L.

In an embodiment, when the lens assembly 320 moves in the first optical axis direction ①, the second protruding portion 345 of the support member 340 may make contact with the damping member 350. For example, when the lens assembly 320 moves a predetermined distance in the first optical axis direction ①, the second protruding portion 345 may make contact with the damping member 350 and may restrict the lens assembly 320 from further moving in the first optical axis direction ①. The damping member 350 formed of an elastic material or a flexible material may absorb an impact or noise when the second protruding portion 345 makes contact with the damping member 350.

In an embodiment, when the lens assembly 320 moves in the second optical axis direction ②, the first protruding portion 344 of the support member 340 may make contact with the damping member 350. For example, when the lens assembly 320 moves a predetermined distance in the second optical axis direction ②, the first protruding portion 344 may make contact with the damping member 350 and may restrict the lens assembly 320 from further moving in the second optical axis direction ②. The damping member 350 formed of an elastic material or a flexible material may absorb an impact or noise when the first protruding portion 344 makes contact with the damping member 350.

Referring to FIG. 12, the camera module 300 according to an embodiment may include the second stopper members 370, in addition to the support member 340 and the damping member 350. The second stopper members 370 (e.g., the linear stoppers 244 of the second stopper members 242 of FIGS. 7 and 8), together with the support member 340 and the damping member 350, may prevent a movement of the lens assembly 320 beyond a specified range in the second optical axis direction ②. A first reflective member 331 may be disposed in the second optical axis direction ② with respect to the lens assembly 320, and when the lens assembly 320 excessively moves in the second optical axis direction ②, the lens assembly 320 is likely to collide with the first reflective member 331 to cause damage to the first reflective member 331. According to an embodiment, the camera module 300 may be configured to primarily limit a movement range of the lens assembly 320 in the second optical axis direction ② through the support member 340 and the damping member 350 and secondarily limit the movement range of the lens assembly 320 in the second optical axis direction ② through the second stopper members 370.

Figure 15:
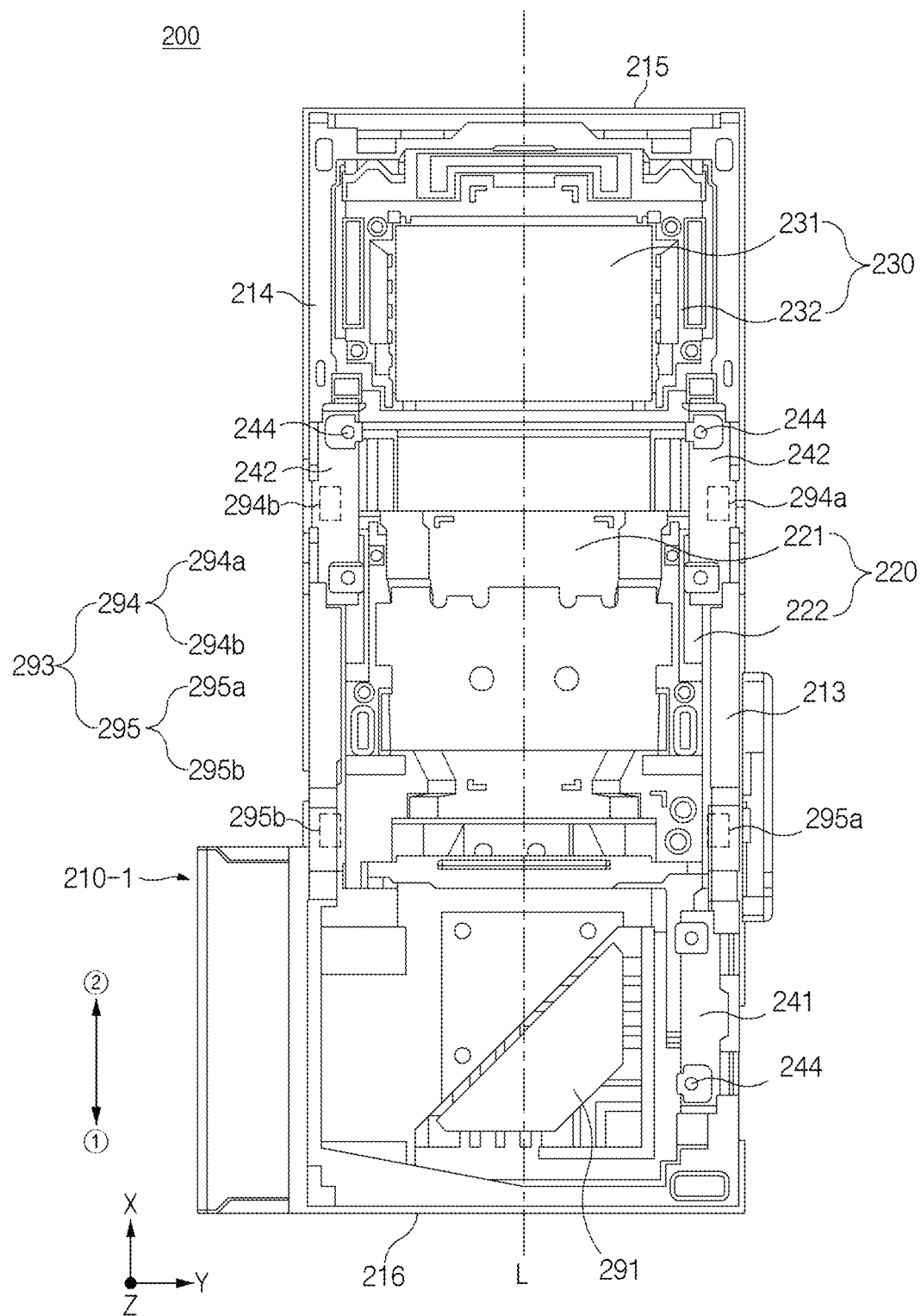
FIG. 15 is a view illustrating the positions of sub-magnets of a camera module according to an embodiment.
Figure 16:
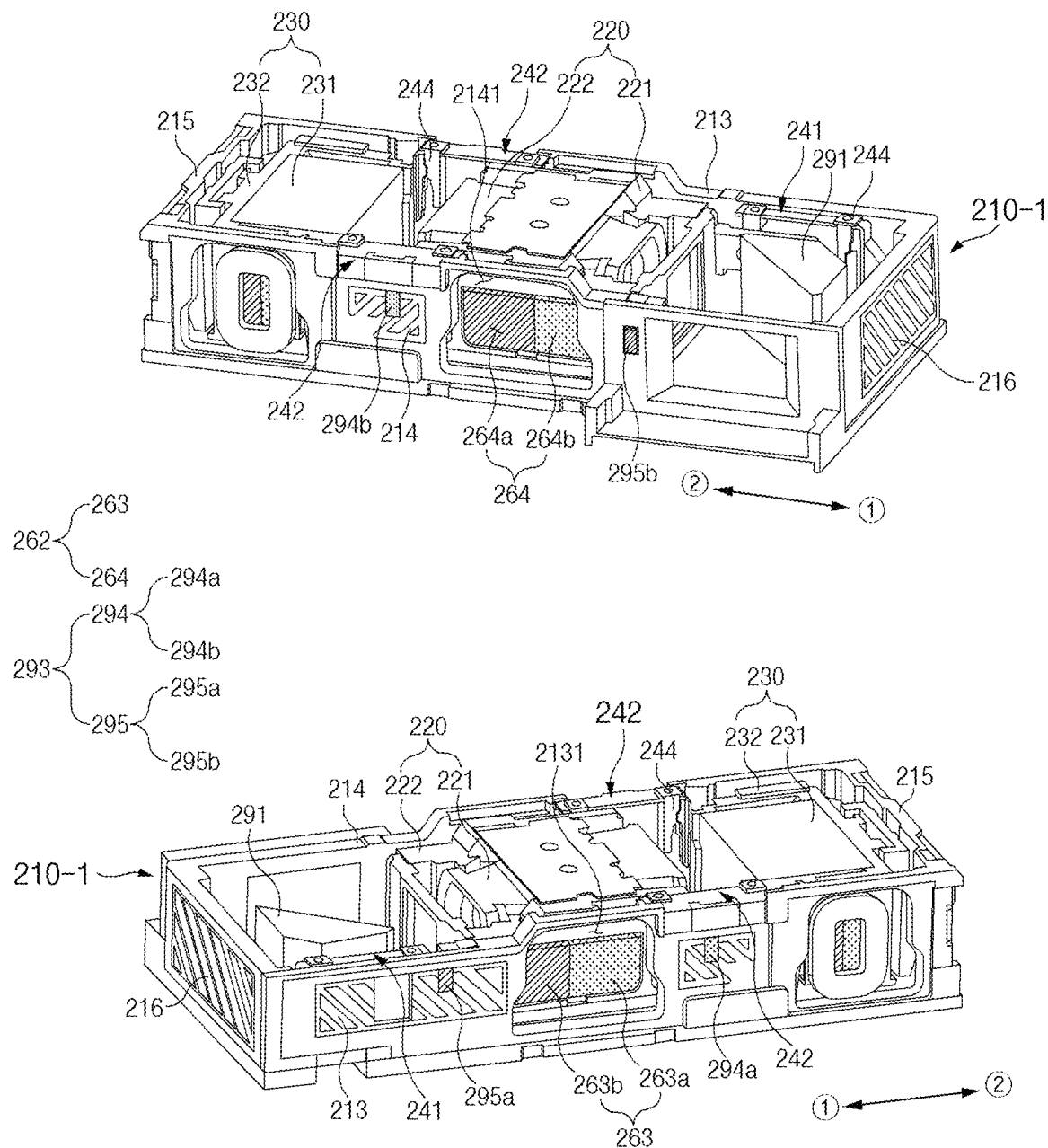
FIG. 16 is a view illustrating operations of the sub-magnets of the camera module according to an embodiment.

FIG. 15 is a view illustrating the positions of sub-magnets 293 of the camera module 200 according to an embodiment. FIG. 16 is a view illustrating operations of the sub-magnets 293 of the camera module 200 according to an embodiment.

Referring to FIGS. 15 and 16, the camera module 200 according to an embodiment may include the first housing 210-1, the lens assembly 220, the reflective member assembly 230, the stopper members 241 and 242, the second reflective member 291, and the sub-magnets 293.

FIGS. 15 and 16 are views illustrating an embodiment further including the sub-magnets 293 that generate repulsive forces with the first magnets 262 disposed on the lens assembly 220 in the camera module 200 illustrated in FIGS. 4 to 8. Some of the components of the camera module 200 illustrated in FIGS. 15 and 16 are identical or similar to the components of the camera module 200 of FIGS. 4 to 8, and therefore repetitive descriptions will hereinafter be omitted.

In an embodiment, the first magnets 262 may be disposed on the lens assembly 220 to provide a driving force for a movement of the lens assembly 220 in the direction of the optical axis L. The first magnets 262 may be configured to electro-magnetically interact with the first coils (e.g., the first coils 261 of FIG. 5). Although not illustrated, the first coils 261 may be located in the first opening area 2131 and the third opening area 2141 of the first housing 210-1 to face the first magnets 262.

In an embodiment, the first magnets 262 may be disposed on side surfaces (e.g., the surfaces facing the y-axis direction) of the lens carrier 222 to face sidewalls (e.g., the first sidewall 213 and the second sidewall 214) of the first housing 210-1 that are parallel to the optical axis L. For example, the first magnets 262 may include a first sidewall magnet 263 facing the first sidewall 213 of the first housing 210-1 and a second sidewall magnet 264 facing the second sidewall 214 of the first housing 210-1. For example, the first sidewall magnet 263 may partially overlap the first opening area 2131 of the first sidewall 213. For example, the second sidewall magnet 264 may partially overlap the third opening area 2141 of the second sidewall 214.

In an embodiment, the first magnets 262 may include first areas 263a and 264a having a first polarity and second areas 263b and 264b having a second polarity opposite to the first polarity. The first areas 263a and 264a and the second areas 263b and 264b may be arranged in the direction of the optical axis L. For example, the first areas 263a and 264a and the second areas 263b and 264b of the first magnets 262 may be arranged in the first optical axis direction ①. For example, the first sidewall magnet 263 may be configured such that the first area 263a has an N pole and the second area 263b located in the first optical axis direction ① from the first area 263a has an S pole. For example, the second sidewall magnet 264 may be configured such that the first area 264a has an S pole and the second area 264b located in the first optical axis direction ① from the first area 264a has an N pole. However, the polarities of the first areas 263a and 264a and the second areas 263b and 264b are not limited to the illustrated embodiment.

In an embodiment, the sub-magnets 293 may interact with the first magnets 262 disposed on the lens assembly 220. For example, the sub-magnets 293 may be configured to generate repulsive forces with the first magnets 262 and reduce the moving speed of the lens assembly 220 when the lens assembly 220 moves.

In an embodiment, the sub-magnets 293 may be disposed on sidewalls (e.g., the first sidewall 213 and the second sidewall 214) of the first housing 210-1 that face the first magnets 262. The sub-magnets 293 may pass through at least parts of the first sidewall 213 and the second sidewall 214 to electro-magnetically interact with the first magnets 262. For example, the sub-magnets 293 may include first sub-magnets 294 having the first polarity and second sub-magnets 295 that are spaced apart from the first sub-magnets 294 in the direction of the optical axis L and that have the second polarity opposite to the first polarity.

In an embodiment, the first sub-magnets 294 may be located in the second optical axis direction ② with respect to the first magnets 262, and the second sub-magnets 295 may be located in the first optical axis direction ① with respect to the first magnets 262. For example, the first sub-magnets 294 and the second sub-magnets 295 may be arranged in the direction of the optical axis L with the first opening area 2131 or the third opening area 2141 therebetween. When the first sidewall 213 or the second sidewall 214 of the first housing 210-1 is viewed in FIG. 16, the first sub-magnets 294, the first areas 263a and 264a of the first magnets 262, the second areas 263b and 264b of the first magnets 262, and the second sub-magnets 295 may be arranged in the direction of the optical axis L. For example, the first sub-magnets 294, the first areas 263a and 264a of the first magnets 262, the second areas 263b and 264b of the first magnets 262, and the second sub-magnets 295 may be sequentially arranged in the first optical axis direction ①.

In an embodiment, the first sub-magnets 294 may interact with the first areas 263a and 264a of the first magnets 262, and the second sub-magnets 295 may interact with the second areas 263b and 264b of the first magnets 262. For example, the first sub-magnets 294 may be configured to have the same polarity as the first areas 263a and 264a to generate repulsive forces with the first areas 263a and 264a of the first magnets 262. The second sub-magnets 295 may be configured to have the same polarity as the second areas 263 and 264b to generate repulsive forces with the second areas 263b and 264b of the first magnets 262.

In an embodiment, the first sub-magnets 294 may include sub-magnet 1-1 294a disposed on the first sidewall 213 and sub-magnet 1-2 294b disposed on the second sidewall 214. In an embodiment, the second sub-magnets 295 may include sub-magnet 2-1 295a disposed on the first sidewall 213 and sub-magnet 2-2 295b disposed on the second sidewall 214. For example, sub-magnet 1-1 294a may have the same polarity (e.g., N pole) as the first area 263a of the first sidewall magnet 263, and sub-magnet 1-2 294b may have the same polarity (e.g., S pole) as the first area 264a of the second sidewall magnet 264. Furthermore, sub-magnet 2-1 295a may have the same polarity (e.g., S pole) as the second area 263b of the first sidewall magnet 263, and sub-magnet 2-2 295b may have the same polarity (e.g., N pole) as the second area 264b of the second sidewall magnet 264.

In an embodiment, when the lens assembly 220 moves in the first optical axis direction ①, the second areas 263b and 264b of the first magnets 262 may move toward the second sub-magnets 295, and repulsive forces may act therebetween. Due to the repulsive forces, a predetermined force may be applied to the lens assembly 220 in the second optical axis direction ②, and therefore the moving speed in the first optical axis direction ① may be reduced. When the lens assembly 220 moves a specified distance or more in the first optical axis direction ①, the speed of the lens assembly 220 may be reduced by the repulsive forces before the lens assembly 220 makes contact with the first stopper member 241 (e.g., the linear stopper 244 of the first stopper member 241), and thus an impact and/or noise caused by the contact may be reduced.

In an embodiment, when the lens assembly 220 moves in the second optical axis direction ②, the first areas 263a and 264a of the first magnets 262 may move toward the first sub-magnets 294, and repulsive forces may act therebetween. Due to the repulsive forces, a predetermined force may be applied to the lens assembly 220 in the first optical axis direction ①, and therefore the moving speed in the second optical axis direction ② may be reduced. When the lens assembly 220 moves a specified distance or more in the second optical axis direction ②, the speed of the lens assembly 220 may be reduced by the repulsive forces before the lens assembly 220 makes contact with the second stopper members 242 (e.g., the linear stoppers 244 of the second stopper members 242), and thus an impact and/or noise caused by the contact (or collision) may be reduced.

Figure 17:
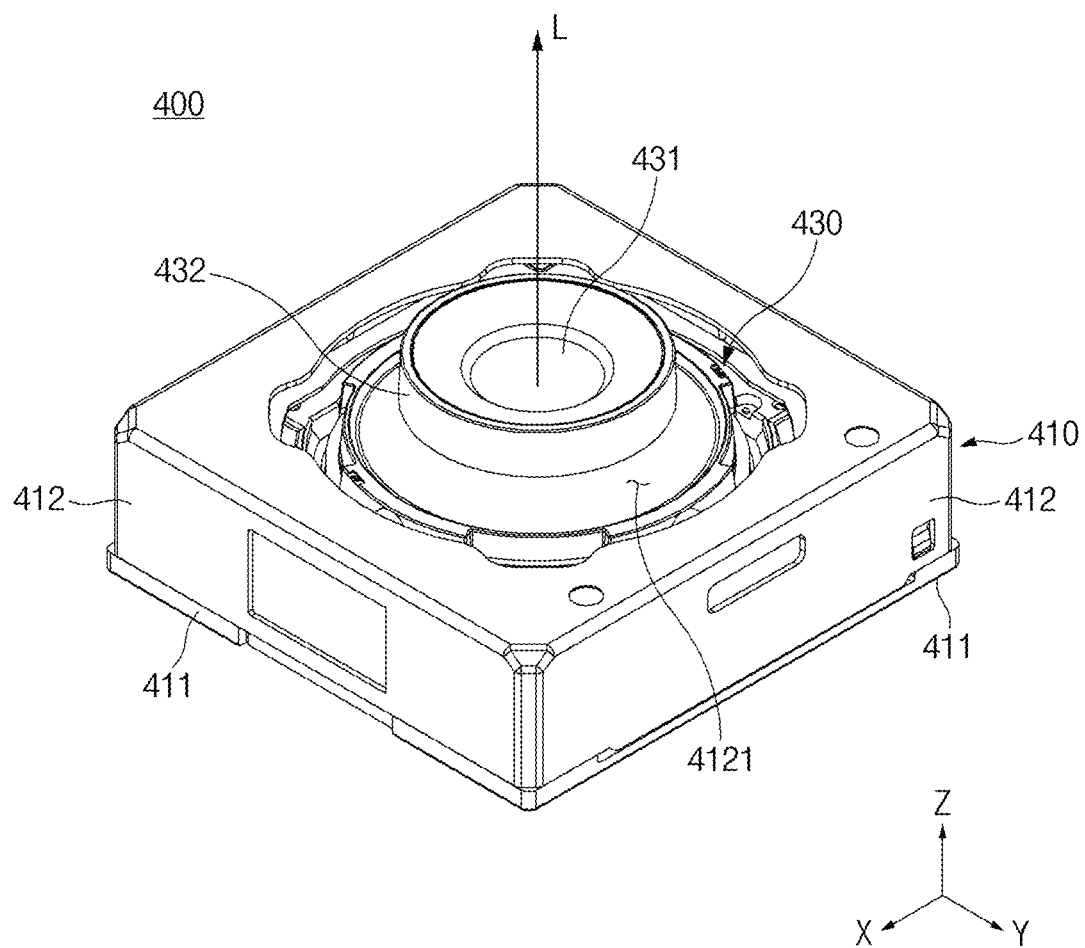
FIG. 17 is a perspective view of a camera module according to an embodiment.
Figure 18:
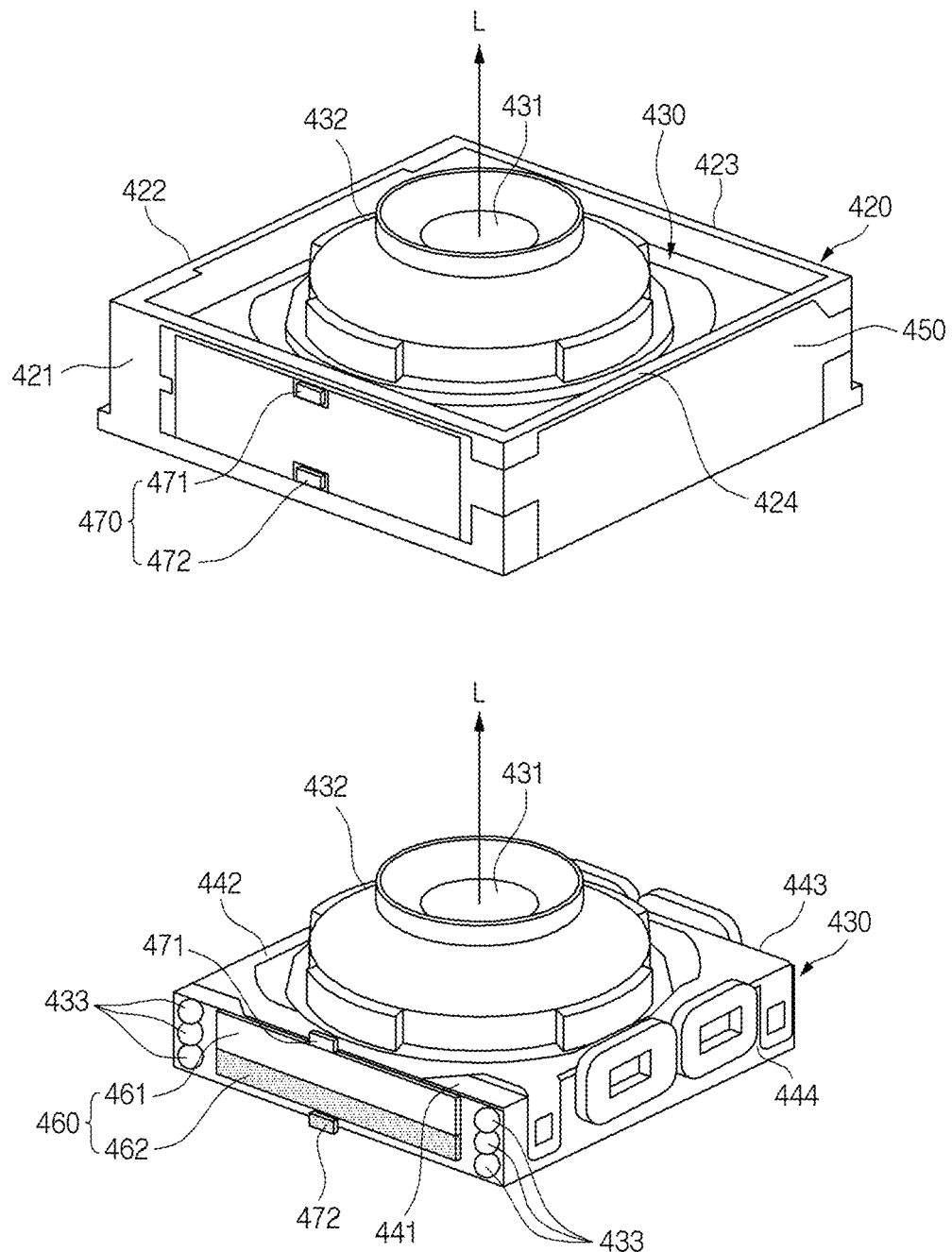
FIG. 18 is a view illustrating the positions of sub-magnets of the camera module according to an embodiment.

FIG. 17 is a perspective view of a camera module 400 according to an embodiment. FIG. 18 is a view illustrating the positions of sub-magnets 470 of the camera module 400 according to an embodiment.

FIGS. 17 and 18 illustrate the camera module 400 having a different structure from the camera module illustrated in FIGS. 15 and 16 (e.g., the camera module 200 of FIGS. 15 and 16). For example, the camera module 200 of FIGS. 15 and 16 may be a camera module (a folded camera) in which the direction in which external light is incident on the camera module 200 and the optical axis of the lens are perpendicular to each other, and the camera module 400 of FIGS. 17 and 18 may be a camera module (a direct type camera) in which the direction in which external light is incident on the camera module 400 and the optical axis of the lens are parallel to each other.

Referring to FIG. 17, the camera module 400 according to an embodiment may include a camera housing 410 (e.g., the camera housing 210 of FIG. 4) and a camera assembly 430 (e.g., the lens assembly 220 of FIG. 5), at least part of which is accommodated in the camera housing 410.

In an embodiment, the camera housing 410 may include a base 411 and a cover 412 coupled to the base 411. The base 411, together with the cover 412, may form an inner space of the camera housing 410 in which the camera assembly 430 is accommodated. For example, the base 411 may form the lower surface (e.g., the flat surface facing the −z-axis direction) of the camera module 400, and the cover 412 may form the upper surface (e.g., the flat surface facing the +z-axis direction) of the camera module 400 and the side surfaces surrounding the upper surface and the lower surface. The cover 412 may have an opening 4121 formed therein through which a lens 431 and at least part of a lens barrel 432 are exposed.

In various embodiments, an image sensor (not illustrated) and a circuit board (not illustrated) that is electrically connected with the image sensor may be disposed on the base 411 of the camera housing 410. In various embodiments, the image sensor may be disposed inside the camera housing 410 so as to be at least partially aligned with the optical axis L of the lens 431. For example, the image sensor may convert an optical signal received through the lens 431 into an electrical signal.

In an embodiment, at least part of the camera assembly 430 may be accommodated in the camera housing 410. The camera assembly 430 may be configured to move in the direction of the optical axis L of the lens inside the camera housing 410. For example, when viewed in the X-Y-Z Cartesian coordinate system, the camera assembly 430 may linearly move in the z-axis direction (e.g., the +z/−z-axis directions) inside the camera housing 410. In an embodiment, the camera module 400 may adjust (e.g., an auto focus (AF) function) the distance between the image sensor (not illustrated) fixedly disposed inside the camera housing 410 and the lens 431 included in the camera assembly 430 by moving the camera assembly 430 in the direction of the optical axis L.

In an embodiment, the camera assembly 430 may include one or more lenses 431 and the lens barrel 432 surrounding the one or more lenses 431. In an embodiment, the camera assembly 430 may be disposed such that the lenses 431 and at least part of the lens barrel 432 are exposed through the opening 4121 formed in the cover 412 of the camera housing 410. In an embodiment, the camera assembly 430 may be configured to receive light external to the electronic device 100 through a partial area of a surface of a housing (e.g., the housing 110 of FIGS. 1 and 2) of an electronic device (e.g., the electronic device 100 of FIGS. 1 to 3). In various embodiments, the camera assembly 430 may include a lens assembly (e.g., the lens assembly 220 of FIG. 5) that includes the one or more lens 431 and the lens barrel 432.

Referring to FIG. 18, the camera module 400 according to an embodiment may include a first magnet 460 providing a driving force for moving the camera assembly 430 in the direction of the optical axis L, a flexible circuit board 450 surrounding sidewalls of the camera housing 410, and the sub-magnets 470 configured to generate a repulsive force with the first magnet 460.

In an embodiment, side surfaces 441, 442, 443, and 444 of the camera assembly 430 may be surrounded by the sidewalls 420 of the camera housing 410. The first magnet 460 may be disposed on a part of the side surfaces 441, 442, 443, and 444 of the camera assembly 430. For example, the first magnet 460 may be disposed on the first side surface 441 of the camera assembly 430. For example, the first side surface 441 of the camera assembly 430 may face a first sidewall 421 of the camera housing 410. Although not illustrated, a first coil (not illustrated) that electro-magnetically interacts with the first magnet 460 may be disposed on the first sidewall 421. For example, the first coil (not illustrated) may be disposed on the flexible circuit board 450 surrounding some of the sidewalls 420 of the camera housing 410 (e.g., the first sidewall 421, the third sidewall 423, and the fourth sidewall 424) and may be located to face the first magnet 460.

In an embodiment, the camera assembly 430 may include, on the first side surface 441 thereof, a plurality of balls 433 that guide a movement of the camera assembly 430 in the direction of the optical axis L. For example, the plurality of balls 433 may be disposed between the first side surface 441 of the camera assembly 430 and the first sidewall 421 of the camera housing 410. The plurality of balls 433 may be configured to roll in the space between the first sidewall 421 and the first side surface 441. For example, when the camera assembly 430 moves in the direction of the optical axis L, the plurality of balls 433 may rotate while linearly moving between the camera assembly 430 and the camera housing 410, or may rotate in position.

In an embodiment, the first magnet 460 may be disposed on the first side surface 441 of the camera assembly 430. The first magnet 460 may include a first area 461 having a first polarity and a second area 462 having a second polarity opposite to the first polarity. The first area 461 and the second area 462 may be arranged in the direction of the optical axis L.

In an embodiment, the sub-magnets 470 may interact with the first magnet 460 disposed on the camera assembly 430. For example, the sub-magnets 470 may be configured to generate a repulsive force with the first magnet 460 and reduce the moving speed of the camera assembly 430 when the camera assembly 430 moves in the direction of the optical axis L. For example, the sub-magnets 470 may be disposed on the first sidewall 421 of the camera housing 410 to interact with the first magnet 460.

In an embodiment, the sub-magnets 470 may include a first sub-magnet 471 having the first polarity and a second sub-magnet 472 that is spaced apart from the first sub-magnet 471 in the direction of the optical axis L and that has the second polarity opposite to the first polarity. For example, the first sub-magnet 471 may be located in a first direction (e.g., +L direction) with respect to the first magnet 460, and the second sub-magnet 472 may be located in the direction (e.g., −L direction) opposite to the first direction with respect to the first magnet 460. For example, the first sub-magnet 471, the first magnet 460, and the second sub-magnet 472 may be arranged in the direction of the optical axis L.

In an embodiment, the first sub-magnet 471 may interact with the first area 461 of the first magnet 460, and the second sub-magnet 472 may interact with the second area 462 of the first magnet 460. For example, the first sub-magnet 471 may be configured to have the same polarity as the first area 461 to generate a repulsive force with the first area 461 of the first magnet 460. The second sub-magnet 472 may be configured to have the same polarity as the second area 462 to generate a repulsive force with the second area 462 of the first magnet 460.

In an embodiment, when the camera assembly 430 moves in the first direction (e.g., the +L direction or the +z-axis direction), the first area 461 of the first magnet 460 may move toward the first sub-magnet 471, and a repulsive force may act therebetween. Due to the repulsive force, a predetermined force may be applied to the camera assembly 430 in the direction (e.g., the −L direction or the −z-axis direction) opposite to the first direction, and therefore the speed of the camera assembly 430 may be reduced.

In an embodiment, when the camera assembly 430 moves in the second direction (e.g., the −L direction or the −z-axis direction) opposite to the first direction, the second area 462 of the first magnet 460 may move toward the second sub-magnet 472, and a repulsive force may act therebetween. Due to the repulsive force, a predetermined force may be applied to the camera assembly 430 in the first direction (e.g., the +L direction or the +z-axis direction), and therefore the speed of the camera assembly 430 may be reduced FIG. 19 is a block diagram illustrating an electronic device 501 in a network environment 500 according to various embodiments.

Referring to FIG. 19, the electronic device 501 in the network environment 500 may communicate with an electronic device 502 via a first network 598 (e.g., a short-range wireless communication network), or at least one of an electronic device 504 or a server 508 via a second network 599 (e.g., a long-range wireless communication network). According to an embodiment, the electronic device 501 may communicate with the electronic device 504 via the server 508. According to an embodiment, the electronic device 501 may include a processor 520, memory 530, an input module 550, a sound output module 555, a display module 560, an audio module 570, a sensor module 576, an interface 577, a connecting terminal 578, a haptic module 579, a camera module 580, a power management module 588, a battery 589, a communication module 590, a subscriber identification module (SIM) 596, or an antenna module 597. In some embodiments, at least one of the components (e.g., the connecting terminal 578) may be omitted from the electronic device 501, or one or more other components may be added in the electronic device 501. In some embodiments, some of the components (e.g., the sensor module 576, the camera module 580, or the antenna module 597) may be implemented as a single component (e.g., the display module 560).

The processor 520 may execute, for example, software (e.g., a program 540) to control at least one other component (e.g., a hardware or software component) of the electronic device 501 coupled with the processor 520, and may perform various data processing or computation. According to one embodiment, as at least part of the data processing or computation, the processor 520 may store a command or data received from another component (e.g., the sensor module 576 or the communication module 590) in volatile memory 532, process the command or the data stored in the volatile memory 532, and store resulting data in non-volatile memory 534. According to an embodiment, the processor 520 may include a main processor 521 (e.g., a central processing unit (CPU) or an application processor (AP)), or an auxiliary processor 523 (e.g., a graphics processing unit (GPU), a neural processing unit (NPU), an image signal processor (ISP), a sensor hub processor, or a communication processor (CP)) that is operable independently from, or in conjunction with, the main processor 521. For example, when the electronic device 501 includes the main processor 521 and the auxiliary processor 523, the auxiliary processor 523 may be adapted to consume less power than the main processor 521, or to be specific to a specified function. The auxiliary processor 523 may be implemented as separate from, or as part of the main processor 521.

The auxiliary processor 523 may control at least some of functions or states related to at least one component (e.g., the display module 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an image signal processor or a communication processor) may be implemented as part of another component (e.g., the camera module 580 or the communication module 590) functionally related to the auxiliary processor 523. According to an embodiment, the auxiliary processor 523 (e.g., the neural processing unit) may include a hardware structure specified for artificial intelligence model processing. An artificial intelligence model may be generated by machine learning. Such learning may be performed, e.g., by the electronic device 501 where the artificial intelligence is performed or via a separate server (e.g., the server 508). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input module 550 may receive a command or data to be used by another component (e.g., the processor 520) of the electronic device 501, from the outside (e.g., a user) of the electronic device 501. The input module 550 may include, for example, a microphone, a mouse, a keyboard, a key (e.g., a button), or a digital pen (e.g., a stylus pen).

The sound output module 555 may output sound signals to the outside of the electronic device 501. The sound output module 555 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 560 may visually provide information to the outside (e.g., a user) of the electronic device 501. The display module 560 may include, for example, a display, a hologram device, or a projector and control circuitry to control a corresponding one of the display, hologram device, and projector. According to an embodiment, the display module 560 may include a touch sensor adapted to detect a touch, or a pressure sensor adapted to measure the intensity of force incurred by the touch.

The audio module 570 may convert a sound into an electrical signal and vice versa. According to an embodiment, the audio module 570 may obtain the sound via the input module 550, or output the sound via the sound output module 555 or a headphone of an external electronic device (e.g., an electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device (e.g., the electronic device 502) directly (e.g., wiredly) or wirelessly. According to an embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device (e.g., the electronic device 502). According to an embodiment, the connecting terminal 578 may include, for example, a HDMI connector, a USB connector, a SD card connector, or an audio connector (e.g., a headphone connector).

The haptic module 579 may convert an electrical signal into a mechanical stimulus (e.g., a vibration or a movement) or electrical stimulus which may be recognized by a user via his tactile sensation or kinesthetic sensation. According to an embodiment, the haptic module 579 may include, for example, a motor, a piezoelectric element, or an electric stimulator.

The camera module 580 may capture a still image or moving images. According to an embodiment, the camera module 580 may include one or more lenses, image sensors, image signal processors, or flashes.

The power management module 588 may manage power supplied to the electronic device 501. According to one embodiment, the power management module 588 may be implemented as at least part of, for example, a power management integrated circuit (PMIC).

The battery 589 may supply power to at least one component of the electronic device 501. According to an embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the application processor (AP)) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or infrared data association (IrDA)) or the second network 599 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The wireless communication module 592 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 592 may support a high-frequency band (e.g., the mmWave band) to achieve, e.g., a high data transmission rate. The wireless communication module 592 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 592 may support various requirements specified in the electronic device 501, an external electronic device (e.g., the electronic device 504), or a network system (e.g., the second network 599). According to an embodiment, the wireless communication module 592 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 597 may transmit or receive a signal or power to or from the outside (e.g., the external electronic device) of the electronic device 501. According to an embodiment, the antenna module 597 may include an antenna including a radiating element composed of a conductive material or a conductive pattern formed in or on a substrate (e.g., a printed circuit board (PCB)). According to an embodiment, the antenna module 597 may include a plurality of antennas (e.g., array antennas). In such a case, at least one antenna appropriate for a communication scheme used in the communication network, such as the first network 598 or the second network 599, may be selected, for example, by the communication module 590 (e.g., the wireless communication module 592) from the plurality of antennas. The signal or the power may then be transmitted or received between the communication module 590 and the external electronic device via the selected at least one antenna. According to an embodiment, another component (e.g., a radio frequency integrated circuit (RFIC)) other than the radiating element may be additionally formed as part of the antenna module 597.

According to various embodiments, the antenna module 597 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 501 and the external electronic device 504 via the server 508 coupled with the second network 599. Each of the electronic devices 502 or 504 may be a device of a same type as, or a different type, from the electronic device 501. According to an embodiment, all or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, mobile edge computing (MEC), or client-server computing technology may be used, for example. The electronic device 501 may provide ultra low-latency services using, e.g., distributed computing or mobile edge computing. In another embodiment, the external electronic device 504 may include an internet-of-things (IoT) device. The server 508 may be an intelligent server using machine learning and/or a neural network. According to an embodiment, the external electronic device 504 or the server 508 may be included in the second network 599. The electronic device 501 may be applied to intelligent services (e.g., smart home, smart city, smart car, or healthcare) based on 5G communication technology or IoT-related technology.

Figure 20:
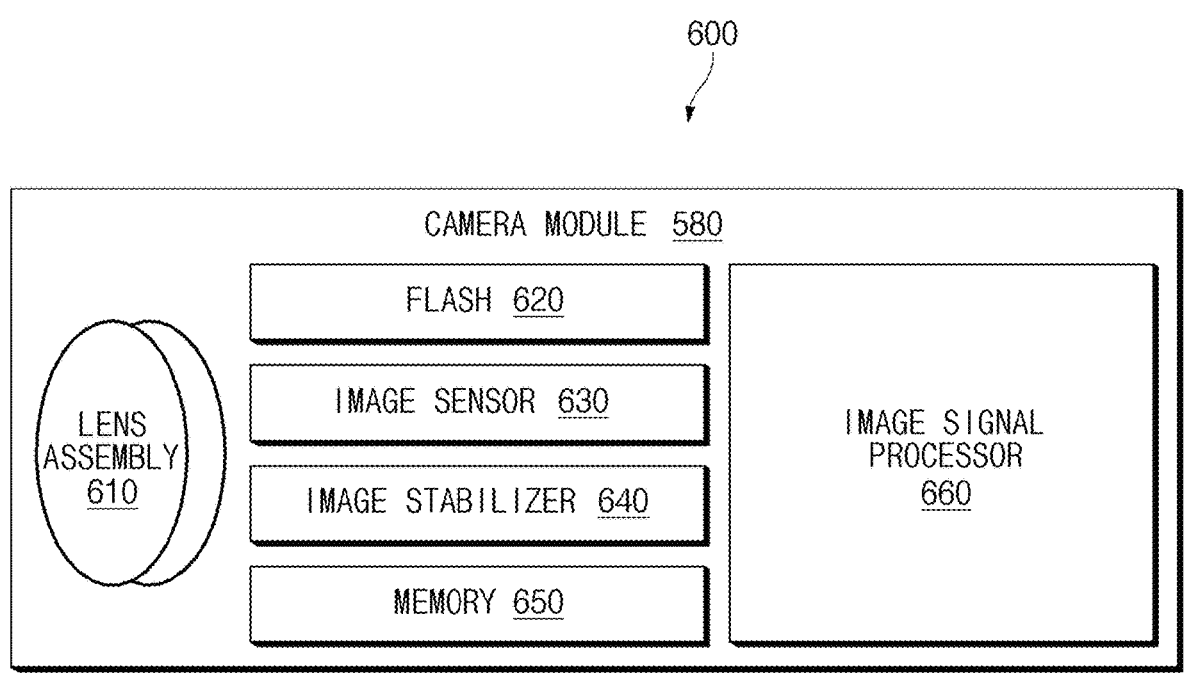
FIG. 20 is a block diagram illustrating a camera module according to various embodiments.

FIG. 20 is a block diagram 600 illustrating the camera module 580 according to various embodiments.

Referring to FIG. 20, the camera module 580 may include a lens assembly 610, a flash 620, an image sensor 630, an image stabilizer 640, memory 650 (e.g., buffer memory), or an image signal processor 660. The lens assembly 610 may collect light emitted or reflected from an object whose image is to be taken. The lens assembly 610 may include one or more lenses. According to an embodiment, the camera module 580 may include a plurality of lens assemblies 610. In such a case, the camera module 580 may form, for example, a dual camera, a 360-degree camera, or a spherical camera. Some of the plurality of lens assemblies 610 may have the same lens attribute (e.g., view angle, focal length, auto-focusing, f number, or optical zoom), or at least one lens assembly may have one or more lens attributes different from those of another lens assembly. The lens assembly 610 may include, for example, a wide-angle lens or a telephoto lens.

The flash 620 may emit light that is used to reinforce light reflected from an object. According to an embodiment, the flash 620 may include one or more light emitting diodes (LEDs) (e.g., a red-green-blue (RGB) LED, a white LED, an infrared (IR) LED, or an ultraviolet (UV) LED) or a xenon lamp. The image sensor 630 may obtain an image corresponding to an object by converting light emitted or reflected from the object and transmitted via the lens assembly 610 into an electrical signal. According to an embodiment, the image sensor 630 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 630 may be implemented using, for example, a charged coupled device (CCD) sensor or a complementary metal oxide semiconductor (CMOS) sensor.

The image stabilizer 640 may move the image sensor 630 or at least one lens included in the lens assembly 610 in a particular direction, or control an operational attribute (e.g., adjust the read-out timing) of the image sensor 630 in response to the movement of the camera module 580 or the electronic device 501 including the camera module 580. This allows compensating for at least part of a negative effect (e.g., image blurring) by the movement on an image being captured. According to an embodiment, the image stabilizer 640 may sense such a movement by the camera module 580 or the electronic device 501 using a gyro sensor (not shown) or an acceleration sensor (not shown) disposed inside or outside the camera module 580. According to an embodiment, the image stabilizer 640 may be implemented, for example, as an optical image stabilizer. The memory 650 may store, at least temporarily, at least part of an image obtained via the image sensor 630 for a subsequent image processing task. For example, if image capturing is delayed due to shutter lag or multiple images are quickly captured, a raw image obtained (e.g., a Bayer-patterned image, a high-resolution image) may be stored in the memory 650, and its corresponding copy image (e.g., a low-resolution image) may be previewed via the display module 560. Thereafter, if a specified condition is met (e.g., by a user's input or system command), at least part of the raw image stored in the memory 650 may be obtained and processed, for example, by the image signal processor 660. According to an embodiment, the memory 650 may be configured as at least part of the memory 530 or as a separate memory that is operated independently from the memory 530.

The image signal processor 660 may perform one or more image processing with respect to an image obtained via the image sensor 630 or an image stored in the memory 650. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 660 may perform control (e.g., exposure time control or read-out timing control) with respect to at least one (e.g., the image sensor 630) of the components included in the camera module 580. An image processed by the image signal processor 660 may be stored back in the memory 650 for further processing, or may be provided to an external component (e.g., the memory 530, the display module 560, the electronic device 502, the electronic device 504, or the server 508) outside the camera module 580. According to an embodiment, the image signal processor 660 may be configured as at least part of the processor 520, or as a separate processor that is operated independently from the processor 520. If the image signal processor 660 is configured as a separate processor from the processor 520, at least one image processed by the image signal processor 660 may be displayed, by the processor 520, via the display module 560 as it is or after being further processed.

According to an embodiment, the electronic device 501 may include a plurality of camera modules 580 having different attributes or functions. In such a case, at least one of the plurality of camera modules 580 may form, for example, a wide-angle camera and at least another of the plurality of camera modules 580 may forma telephoto camera. Similarly, at least one of the plurality of camera modules 580 may form, for example, a front camera and at least another of the plurality of camera modules 580 may forma rear camera.

A camera module 200 according to an embodiment of the disclosure may include a camera housing 210, a lens assembly 220, at least part of which is accommodated in the camera housing 210, the lens assembly 220 including a lens, in which the lens assembly 220 moves in a direction of an optical axis L of the lens inside the camera housing 210, and a stopper member 240 coupled to the inside of the camera housing 210 and configured such that at least part of the stopper member 240 is brought into contact with, or spaced apart from, the lens assembly 220 to limit a movement range of the lens assembly 220 in the direction of the optical axis L. The stopper member 240 may include a first stopper member 241 configured such that at least part thereof makes contact with the lens assembly 220 when the lens assembly 220 moves in a first optical axis direction ① and a second stopper member 242 configured such that at least part thereof makes contact with the lens assembly 220 when the lens assembly 220 moves in a second optical axis direction ② opposite to the first optical axis direction ①.

In various embodiments, each of the first stopper member 241 and the second stopper member 242 may include a linear stopper 244 aligned with the lens assembly 220 in the direction of the optical axis L, and the lens assembly 220 may be configured such that a movement in the first optical axis direction ① is substantially limited by contact with the linear stopper 244 of the first stopper member 241 and a movement in the second optical axis direction ② is substantially limited by contact with the linear stopper 244 of the second stopper member 242.

In various embodiments, the linear stopper 244 may include a recess 248 formed in at least part thereof to absorb or dissipate an impact caused by collision when the lens assembly 220 makes contact with the linear stopper 244.

In various embodiments, the linear stopper 244 may overlap at least part of the lens assembly 220 when viewed in the direction of the optical axis L.

In various embodiments, each of the first stopper member 241 and the second stopper member 242 may include a base part 243 coupled to the camera housing 210 and a linear stopper 244 disposed on a partial area of the base part 243 to face the lens assembly 220. The linear stopper 244 may include a fixed portion 247 fixed to the base part 243 and a flexible portion 246 extending to be spaced apart from the fixed portion 247 by a predetermined gap. The flexible portion 246 may be brought into contact with, or spaced apart from, the lens assembly 220 as the lens assembly 220 moves in the direction of the optical axis L.

In various embodiments, the linear stopper 244 may further include a recess 248 formed between the flexible portion 246 and the fixed portion 247, and the flexible portion 246 of the linear stopper 244 may be configured such that at least part thereof moves in a direction toward or away from the fixed portion 247 as the lens assembly 220 is brought into contact with, or spaced apart from, the flexible portion 246.

In various embodiments, each of the first stopper member 241 and the second stopper member 242 may further include the buffer stopper 245 disposed on another area of the base part 243. The base part 243 may include a first portion 243*a* extending in the direction of the optical axis L and a second portion 243*b* vertically extending from the first portion 243*a*. The linear stopper 244 may be disposed on a first surface 2433 of the second portion 243*b*, and the buffer stopper 245 may be disposed on a second surface 2434 of the second portion 243*b* that is opposite to the first surface 2433.

In various embodiments, the first stopper member 241 may be coupled to a sidewall of the camera housing 210 such that the linear stopper 244 of the first stopper member 241 faces the second optical axis direction ② and the buffer stopper 245 of the first stopper member 241 faces the first optical axis direction ①.

In various embodiments, the second stopper member 242 may be coupled to a sidewall of the camera housing 210 such that the linear stopper 244 of the second stopper member 242 faces the first optical axis direction ① and the linear stopper 244 of the second stopper member 242 faces the second optical axis direction ②.

In various embodiments, the camera housing 210 may include a first sidewall 213 parallel to the optical axis L, a second sidewall 214 that faces the first sidewall 213, and a third sidewall 215 and a fourth sidewall 216 that connect the first sidewall 213 and the second sidewall 214 and face each other. The first stopper member 241 may be coupled to the first sidewall 213, and the second stopper member 242 may be coupled to at least one of the first sidewall 213 or the second sidewall 214.

In various embodiments, the camera housing may further include a first coil 261 and a first magnet 262 that move the lens assembly 220 in the direction of the optical axis L. One of the first coil 261 and the first magnet 262 may be disposed on the lens assembly 220, and the other one of the first coil 261 and the first magnet 262 may be disposed on the camera housing 210.

In various embodiments, the first magnet 262 may be disposed on the lens assembly 220 to face a first sidewall 213 of the camera housing 210 parallel to the optical axis L and may include a first area having a first polarity and a second area having a second polarity opposite to the first polarity, and the first area and the second area may be arranged in the first optical axis direction ①.

In various embodiments, the camera module may further include a sub-magnet 293 that is disposed on the first sidewall 213 of the camera housing 210 and that generates a repulsive force with the first magnet 262. The sub-magnet 293 may include a first sub-magnet 294 having the first polarity and a second sub-magnet 295 having the second polarity, the first sub-magnet 294 being located in the second optical axis direction ② with respect to the first magnet 262, and the second sub-magnet 295 being located in the first optical axis direction ① with respect to the first magnet 262.

In various embodiments, the lens assembly 220 may include a lens unit 221 including the lens and a lens carrier 222 in which at least part of the lens unit 221 is accommodated, and the lens carrier 222 may be coupled to the inside of the camera housing 210 so as to be linearly movable in the direction of the optical axis L.

In various embodiments, the camera module may further include a reflective member assembly 230, at least part of which is disposed in the camera housing 210, the reflective member assembly 230 being aligned with the lens assembly 220 in the direction of the optical axis L. The reflective member assembly 230 may include a first reflective member 231 and a holder 232 that supports the first reflective member 231. At least part of the second stopper member 242 may be located between the holder 232 of the reflective member assembly 230 and the lens assembly 220.

A camera module 200, 300 according to an embodiment of the disclosure may include a camera housing 310 including a light receiving area 211 on which external light is incident, in which an image sensor 281 is disposed on one side of the camera housing 310, a lens assembly 320 that is accommodated in the camera housing 310 and that includes a lens and moves in a direction of an optical axis L of the lens inside the camera housing 310, a first reflective member 331 that is accommodated in the camera housing 310 and that directs the external light incident through the light receiving area 211 toward the lens, a second reflective member 291 that is disposed in the camera housing 310 to face the first reflective member 331 with the lens assembly 320 therebetween and that directs the external light passing through the lens toward the image sensor 281, a support member 340 that is coupled to the lens assembly 320 to move together with the lens assembly 320 and that extends toward the second reflective member 291, and a damping member 350 that is disposed on a sidewall of the camera housing 310 and that makes contact with one portion or another portion of the support member 340 as the lens assembly 320 moves in the direction of the optical axis L.

In various embodiments, the second reflective member 291 may be located in a first optical axis direction ① from the lens assembly 320, and the first reflective member 331 may be located in a second optical axis direction ② from the lens assembly 320, the second optical axis direction ② being opposite to the first optical axis direction ①. The first reflective member 331 may be aligned with the light receiving area 211 in a direction perpendicular to the optical axis L such that at least part of the first reflective member 331 is exposed outside the camera housing 310 through the light receiving area 211.

In various embodiments, the support member 340 may include a first portion 341 extending in the direction of the optical axis L, a second portion 342 extending perpendicular to the optical axis L from an end portion of the first portion 341 that faces the first optical axis direction ①, and a third portion 343 extending perpendicular to the optical axis L from an end portion of the first portion that faces the second optical axis direction ②.

In various embodiments, the second portion 342 may be configured to make contact with the damping member 350 as the lens assembly 320 moves in the second optical axis direction ②, and the third portion 343 may be configured to make contact with the damping member 350 as the lens assembly 320 moves in the first optical axis direction ①.

In various embodiments, the damping member 350 may include an elastic member such as springs 351, 352.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 540) including one or more instructions that are stored in a storage medium (e.g., internal memory 536 or external memory 538) that is readable by a machine (e.g., the electronic device 501). For example, a processor (e.g., the processor 520) of the machine (e.g., the electronic device 501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Although the present disclosure has been described with various embodiments, various changes and modifications may be suggested to one skilled in the art. It is intended that the present disclosure encompass such changes and modifications as fall within the scope of the appended claims.

What is claimed is:

1. A camera module comprising:
    a camera housing;
    a lens assembly including a lens and at least part of the lens assembly is accommodated in the camera housing, wherein the lens assembly is configured to move along a direction of an optical axis of the lens inside the camera housing; and
    a stopper member coupled to the inside of the camera housing, and at least part of the stopper member limits a movement range of the lens assembly in the direction of the optical axis,
    wherein the stopper member includes:
        a first stopper member to limit the movement range of the lens assembly in a first optical axis direction; and
        a second stopper member to limit the movement range of the lens assembly in a second optical axis direction opposite to the first optical axis direction, and
    wherein the first stopper member and the second stopper member are configured to provide damping when the lens assembly makes contact with the first stopper member and the second stopper member,
    each of the first stopper member and the second stopper member includes a linear stopper aligned with the lens assembly in the direction of the optical axis, and
    a movement of the lens assembly in the first optical axis direction is substantially limited by contact with the linear stopper of the first stopper member and a movement of the lens assembly in the second optical axis direction is substantially limited by contact with the linear stopper of the second stopper member,
    wherein the linear stopper includes a recess formed to absorb or dissipate an impact caused by a collision when the lens assembly makes contact with the linear stopper.

2. The camera module of claim 1, wherein the linear stopper overlaps at least part of the lens assembly when viewed in the direction of the optical axis.

3. The camera module of claim 1, wherein:
each of the first stopper member and the second stopper member includes a base part coupled to the camera housing and a linear stopper disposed on a partial area of the base part to face the lens assembly,
the linear stopper includes a fixed portion fixed to the base part and a flexible portion spaced apart from the fixed portion by a predetermined gap, and
the flexible portion is brought into contact with, or spaced apart from, the lens assembly as the lens assembly moves in the direction of the optical axis.

4. The camera module of claim 3, wherein:
the linear stopper further includes the recess formed between the flexible portion and the fixed portion, and
the flexible portion of the linear stopper is configured to bend in a direction toward or away from the fixed portion as the lens assembly is brought into contact with, or spaced apart from, the flexible portion.

5. The camera module of claim 3, wherein:
each of the first stopper member and the second stopper member further includes a buffer stopper disposed on another area of the base part,
the base part includes a first portion extending in the direction of the optical axis and a second portion perpendicularly extending from the first portion,
the linear stopper is disposed on a first surface of the second portion, and
the buffer stopper is disposed on a second surface of the second portion, the second surface is opposite to the first surface.

6. The camera module of claim 5, wherein the first stopper member is coupled to a sidewall of the camera housing such that the linear stopper of the first stopper member faces the second optical axis direction and the buffer stopper of the first stopper member faces the first optical axis direction.

7. The camera module of claim 5, wherein the second stopper member is coupled to a sidewall of the camera housing such that the linear stopper of the second stopper member faces the first optical axis direction and the buffer stopper of the second stopper member faces the second optical axis direction.

8. The camera module of claim 1, wherein:
the camera housing includes a first sidewall parallel to the optical axis, a second sidewall parallel to the first sidewall, and a third sidewall and a fourth sidewall configured to connect the first sidewall and the second sidewall and are parallel, and
the first stopper member is coupled to the first sidewall, and the second stopper member is coupled to at least one of the first sidewall or the second sidewall.

9. The camera module of claim 1, further comprising:
a first coil and a first magnet configured to move the lens assembly in the direction of the optical axis,
wherein one of the first coil and the first magnet is disposed on the lens assembly, and another one of the first coil and the first magnet is disposed on the camera housing.

10. The camera module of claim 9, wherein:
the first magnet is disposed on the lens assembly to face a first sidewall of the camera housing parallel to the optical axis and includes a first area having a first polarity and a second area having a second polarity opposite to the first polarity, and
the first area and the second area are arranged in the first optical axis direction.

11. The camera module of claim 10, further comprising:
a sub-magnet disposed on the first sidewall of the camera housing and configured to generate a repulsive force with the first magnet,
wherein the sub-magnet includes:
a first sub-magnet having the first polarity and located in the second optical axis direction with respect to the first magnet, and
a second sub-magnet having the second polarity and located in the first optical axis direction with respect to the first magnet.

12. The camera module of claim 1, wherein:
the lens assembly includes a lens unit including the lens and a lens carrier in which at least part of the lens unit is accommodated, and
the lens carrier is coupled to the inside of the camera housing so as to be linearly movable in the direction of the optical axis.

13. The camera module of claim 1, further comprising:
a reflective member assembly, at least part of which is disposed in the camera housing, the reflective member assembly aligned with the lens assembly in the direction of the optical axis,
wherein the reflective member assembly includes a first reflective member and a holder configured to support the first reflective member, and
wherein at least part of the second stopper member is located between the holder of the reflective member assembly and the lens assembly.

\* \* \* \* \*